United States Patent
Kim et al.

(10) Patent No.: US 11,195,586 B2
(45) Date of Patent: Dec. 7, 2021

(54) MEMORY DEVICE AND OPERATING METHOD OF THE MEMORY DEVICE

(71) Applicant: SK hynix Inc., Icheon-si (KR)

(72) Inventors: Jong Woo Kim, Yongin-si (KR); Chi Wook An, Icheon-si (KR); Un Sang Lee, Cheongju-si (KR); Hwang Huh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/881,852

(22) Filed: May 22, 2020

(65) Prior Publication Data

US 2021/0118513 A1    Apr. 22, 2021

(30) Foreign Application Priority Data

Oct. 16, 2019 (KR) .......................... 10-2019-0128692

(51) Int. Cl.
| | |
|---|---|
| *G11C 7/00* | (2006.01) |
| *G11C 16/26* | (2006.01) |
| *G11C 16/24* | (2006.01) |
| *G11C 16/10* | (2006.01) |
| *G11C 16/04* | (2006.01) |

(52) U.S. Cl.
CPC .......... *G11C 16/26* (2013.01); *G11C 16/0483* (2013.01); *G11C 16/10* (2013.01); *G11C 16/24* (2013.01)

(58) Field of Classification Search
CPC ....... G11C 7/1051; G11C 7/22; G11C 7/1072; G11C 7/1006; G11C 7/1066
USPC .......................... 365/189.15, 189.14, 185.18
See application file for complete search history.

(56) References Cited

U.S. PATENT DOCUMENTS

| | | | | |
|---|---|---|---|---|
| 9,412,471 | B2* | 8/2016 | Kim ..................... | G06F 11/1068 |
| 9,530,515 | B2* | 12/2016 | Lasser .................. | G11C 29/028 |
| 2010/0302850 | A1* | 12/2010 | Kim .................... | G11C 16/0483 |
| | | | | 365/185.09 |
| 2014/0063950 | A1 | 3/2014 | Baek et al. | |
| 2014/0269085 | A1 | 9/2014 | Lasser | |
| 2017/0345503 | A1* | 11/2017 | Kim ................... | G11C 16/3427 |
| 2018/0261292 | A1 | 9/2018 | Helm et al. | |

FOREIGN PATENT DOCUMENTS

| | | |
|---|---|---|
| KR | 1020140028571 A | 3/2014 |
| KR | 1020190036285 A | 4/2019 |

* cited by examiner

*Primary Examiner* — Son T Dinh
(74) *Attorney, Agent, or Firm* — William Park & Associates Ltd.

(57) ABSTRACT

A memory device and a method of operating the memory device are provided. The memory device includes a memory cell array including memory cells that are programmed into a plurality of program states, a peripheral circuit configured to perform a read operation on the memory cell array, and control logic configured to control the peripheral circuit to perform the read operation and to control the peripheral circuit to perform a masking process on first memory cells having a threshold voltage level higher than a first read level and second memory cells having a threshold voltage level lower than a second read level among the memory cells during the read operation.

21 Claims, 14 Drawing Sheets

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2019-0128692, filed on Oct. 16, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method operating the memory device.

2. Related Art

Recently, a paradigm with respect to a computing environment has changed to ubiquitous computing which is capable of using a computer system virtually anytime and anywhere. Accordingly, use of portable electronic devices, such as a mobile phone, a digital camera, and a laptop, has been rapidly increasing. The portable electronic devices as described above may generally use memory systems employing memory devices, that is, data storage devices. A data storage device may be used as a main memory device or an auxiliary memory device of a portable electronic device.

A data storage device employing a memory device does not include a mechanical driver, and thus may have excellent stability and durability with an extremely high information access speed and low power consumption. Examples of a memory system having the above-stated characteristics are a data storage device including a Universal Serial Bus (USB) memory device, a memory card having various interfaces, and a Solid-State Drive (SSD).

Memory devices are generally classified into volatile memory devices and nonvolatile memory devices.

A nonvolatile memory device may have comparatively low write and read speeds, but may retain stored data in the absence of supplied power. Therefore, a nonvolatile memory device may be used when there is a need for storing data which should be retained regardless of a supply of power. Examples of nonvolatile memory devices include Read Only Memory (ROM), Mask ROM (MROM), Programmable ROM (PROM), Erasable Programmable ROM (EPROM), Electrically Erasable Programmable ROM (EEPROM), flash memory, Phase change Random Access Memory (PRAM), Magnetic RAM (MRAM), Resistive RAM (RRAM), and Ferroelectric RAM (FRAM). Flash memory may be classified into NOR-type memory and NAND-type memory.

SUMMARY

According to an embodiment, a memory device may include a memory cell array including memory cells that are programmed into a plurality of program states, a peripheral circuit configured to perform a read operation on the memory cell array, and control logic configured to control the peripheral circuit to perform the read operation and to control the peripheral circuits to perform a masking process on first memory cells having a threshold voltage level higher than a first read level and second memory cells having a threshold voltage level lower than a second read level among the memory cells during the read operation.

According to an embodiment, a memory device may include a page including a plurality of memory cells coupled in common to a word line, a peripheral circuit configured to perform a read operation on the page, and control logic configured to control the peripheral circuit to perform the read operation, wherein, during the read operation, the control logic controls the peripheral circuits to perform a first sensing operation in which first memory cells having a threshold voltage level higher than or equal to a first read level that is higher than a main read level, among the plurality of memory cells, are sensed, a second sensing operation in which second memory cells having a threshold voltage level lower than or equal to a second read level that is lower than the main read level, among the plurality of memory cells, are sensed, and a third sensing operation in which the plurality of memory cells are sensed in a state where a masking process is performed on the first memory cells and the second memory cells.

According to an embodiment, a method of operating a memory device may include performing a first sensing operation in which first memory cells having a threshold voltage level higher than or equal to a first read level that is higher than a main read level, among a plurality of memory cells, are sensed, performing a second sensing operation in which second memory cells having a threshold voltage level lower than or equal to a second read level that is lower than the main read level, among the plurality of memory cells, are sensed, performing a masking process on the first memory cells and the second memory cells, and performing a third sensing operation in which whether a threshold voltage level of the plurality of memory cells is higher or lower than the main read level is sensed.

DETAILED DESCRIPTION

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Hereinafter, embodiments of the present disclosure are described with reference to the accompanying drawings in order for those skilled in the art to be able to readily implement the technical spirit of the present disclosure.

Various embodiments are directed to a memory device capable of improving the reliability of a read operation, and a method of operating the memory device.

Figure 1:
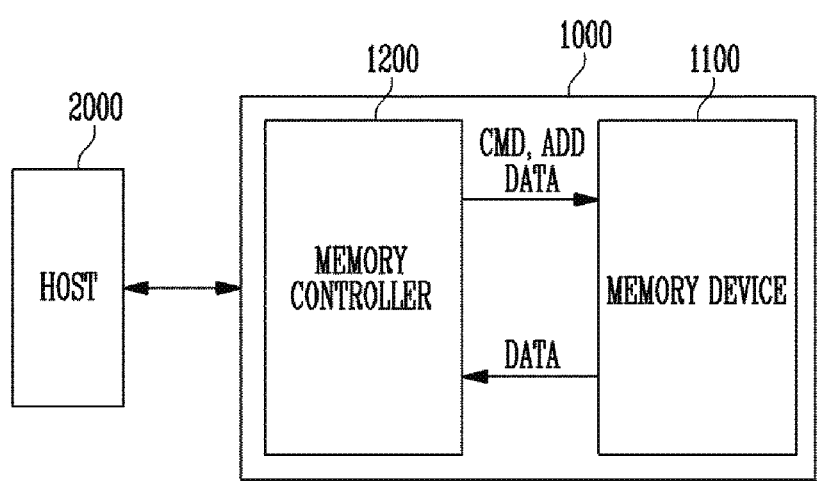
FIG. 1 is a block diagram illustrating a memory system according to an embodiment.

FIG. 1 is a diagram illustrating a memory system 1000 according to an embodiment.

Referring to FIG. 1, the memory system 1000 may include a memory device 1100 storing data and a memory controller 1200 controlling the memory device 1100 in response to control of a host 2000.

The host 2000 may communicate with the memory system 1000 using an interface protocol such as Peripheral Component Interconnect-Express (PCI-E), Advanced Technology Attachment (ATA), Serial ATA (SATA), Parallel ATA (PATA), or serial attached SCSI (SAS). In addition, the interface protocols provided for the purpose of communication between the host 2000 and the memory system 1000 are not limited to the above examples and may be one of interface protocols such as a Universal Serial Bus (USB), a Multi-Media Card (MMC), an Enhanced Small Disk Interface (ESDI), or Integrated Drive Electronics (IDE).

The memory controller 1200 may control the general operations of the memory system 1000 and control data exchange between the host 2000 and the memory device 1100. For example, the memory controller 1200 may control the memory device 1100 to program or read data in response to a request from the host 2000. During a program operation, the memory controller 1200 may transmit a command CMD, an address ADD, and data DATA to be programmed corresponding to the program operation to the memory device 1100. In addition, during a read operation, the memory controller 1200 may receive and temporarily store the data DATA read from the memory device 1100 and may transmit the temporarily stored data DATA to the host 2000.

The memory device 1100 may perform a program operation, a read operation, or an erase operation under the control of the memory controller 1200. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or flash memory.

Figure 2:
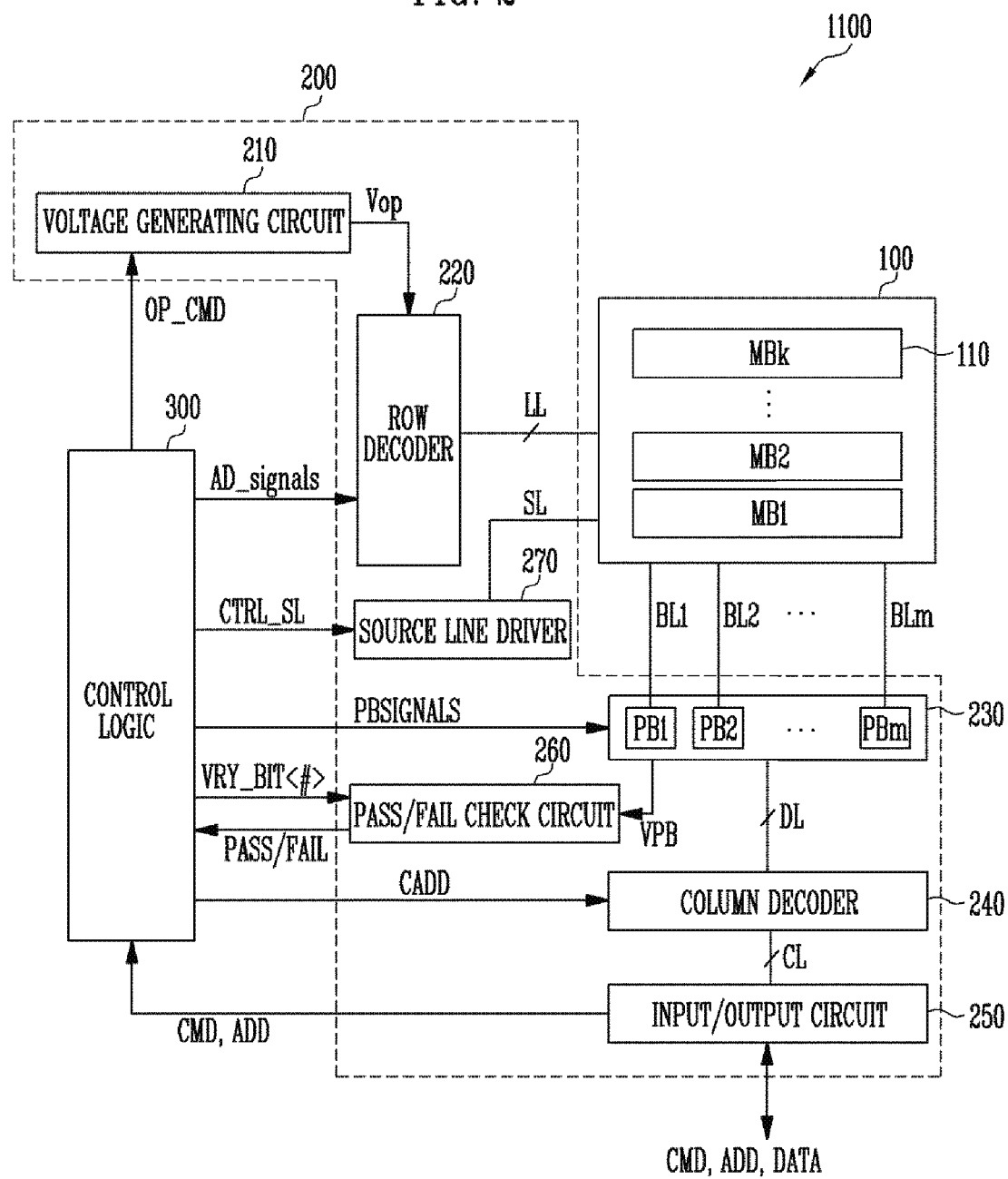
FIG. 2 is a diagram illustrating a memory device shown in FIG. 1.

FIG. 2 is a diagram illustrating the memory device 1100 shown in FIG. 1.

Referring to FIG. 2, the memory device 1100 may include a memory cell array 100 storing data. The memory device 1100 may include a peripheral circuit 200 configured to perform a program operation to store data in the memory cell array 100, a read operation to output the stored data, and an erase operation to erase the stored data. The memory device 1100 may include control logic 300 which controls the peripheral circuit 200 in response to control of the memory controller 1200 shown in FIG. 1. The control logic 300 may be implemented as hardware, software, or a combination of hardware and software. For example, the control logic 300 may be a control logic circuit operating in accordance with an algorithm and/or a processor executing control logic code.

The memory cell array 100 may include a plurality of memory blocks (MB1 to MBk) 110, where k is a positive integer. Local lines LL and bit lines BL1 to BLm may be coupled to each of the memory blocks (MB1 to MBk) 110, where m is a positive integer. For example, the local lines LL may include a first select line, a second select line, and a plurality of word lines arranged between the first and second select lines. In addition, the local lines LL may include dummy lines arranged between the first select line and the word lines and between the second select line and the word lines. The first select line may be a source select line and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks (MB1 to MBk) 110, respectively, and the bit lines BL1 to BLm may be commonly coupled to the memory blocks (MB1 to MBk) 110. The memory blocks (MB1 to MBk) 110 may have a two-dimensional or three-dimensional structure. For example, in the two-dimensionally structured memory blocks 110, memory cells may be arranged in parallel with a substrate. For example, in the three-dimensionally structured memory blocks 110, memory cells may be stacked in a vertical direction to the substrate.

The peripheral circuit 200 may be configured to perform program, read, and erase operations on the selected memory block 110 in response to control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop applied to perform program, read and erase operations in response to an operation signal OP_CMD. In addition, the voltage generating circuit 210 may selectively discharge the local lines LL in response to the operation signal OP_CMD. For example, the voltage generating circuit 210 may generate a read voltage, a program voltage, a pass voltage, and the like in response to control of the control logic 300.

The row decoder 220 may transmit the operating voltages Vop to the local lines LL coupled to the selected memory block 110 in response to row decoder control signals AD_signals. For example, the row decoder 220 may apply a read voltage generated by the voltage generating circuit 210 to a selected word line, among the local lines LL, and may apply a pass voltage generated by the voltage generating circuit 210 to unselected word lines in response to the row decoder control signals AD_signals during a read operation. In addition, the row decoder 220 may apply a program voltage generated by the voltage generating circuit 210 to a selected word line, among the local lines LL, and may apply a pass voltage generated by the voltage generating circuit 210 to unselected word lines in response to the row decoder control signals AD_signals during a program operation.

The page buffer group 230 may include a plurality of page buffers PB1 to PBm coupled to the bit lines BL1 to BLm, respectively. The page buffers PB1 to PBm may operate in response to page buffer control signals PBSIGNALS. For example, the page buffers PB1 to PBm may temporarily store data to be programmed and adjusting a potential level of the bit lines BL1 to BLm based on the temporarily stored data to be programmed during a program operation. In addition, a voltage or a current of the bit lines BL1 to BLm may be sensed to read data during a read or verify operation.

The column decoder 240 may transmit data between the input/output circuit 250 and the page buffer group 230 in response to a column address CADD. For example, the column decoder 240 may exchange data with the page buffers PB1 to PBm through data lines DL, or exchange data with the input/output circuit 250 through column lines CL.

The input/output circuit 250 may transmit the command CMD and the address ADD received from the memory controller 1200 shown in FIG. 1 to the control logic 300, or may exchange the data DATA with the column decoder 240.

The pass/fail check circuit 260 may generate a reference current in response to an allowable bit VRY_BIT<#> and output a pass signal PASS or a fail signal FAIL by comparing a sensing voltage VPB received from the page buffer group 230 with a reference voltage generated by the reference current during a read operation or a program verify operation. The sensing voltage VPB may be a voltage controlled based on the number of memory cells that are determined as passed during a program verify operation.

The source line driver 270 may be coupled to the memory cells included in the memory cell array 100 through the source line SL and may control a voltage applied to the source line SL. The source line driver 270 may receive a source line control signal CTRL_SL from the control logic 300 and control a source line voltage applied to the source line SL based on the source line control signal CTRL_SL.

The control logic 300 may control the peripheral circuit 200 by outputting the operation signal OP_CMD, the row decoder control signals AD_signals, the page buffer control signals PBSIGNALS, and the allowable bit VRY_BIT<#> in response to the command CMD and the address ADD.

The control logic 300 may control the peripheral circuit 200 to perform a first sensing operation on a first read level higher than a main read level, a second sensing operation on a second read level lower than the main read level, and a main sensing operation on the main read level during a read operation. The control logic 300 may control the page buffer group 230 to apply a ground voltage to bit lines of memory cells having a threshold voltage level higher than the first read level and memory cells having a threshold voltage level lower than the second read level based on results of the first sensing operation and the second sensing operation, during the main sensing operation.

Accordingly, sensing error caused by a noise phenomenon between bit lines may be reduced by performing a masking process on the memory cells having a threshold voltage level higher than the first read level and the memory cells having a threshold voltage level lower than the second read level during the read operation on the memory cells having a threshold voltage distribution between the first read level and the second read level. In other words, a probability that the ground voltage is applied to bit lines adjacent to the bit lines coupled to the memory cells having the threshold voltage distribution between the first read level and the second read level may be high. Therefore, the noise phenomenon of the bit lines coupled to the memory cells having the threshold voltage distribution between the first read level and the second read level may be prevented or lessened.

Figure 3:
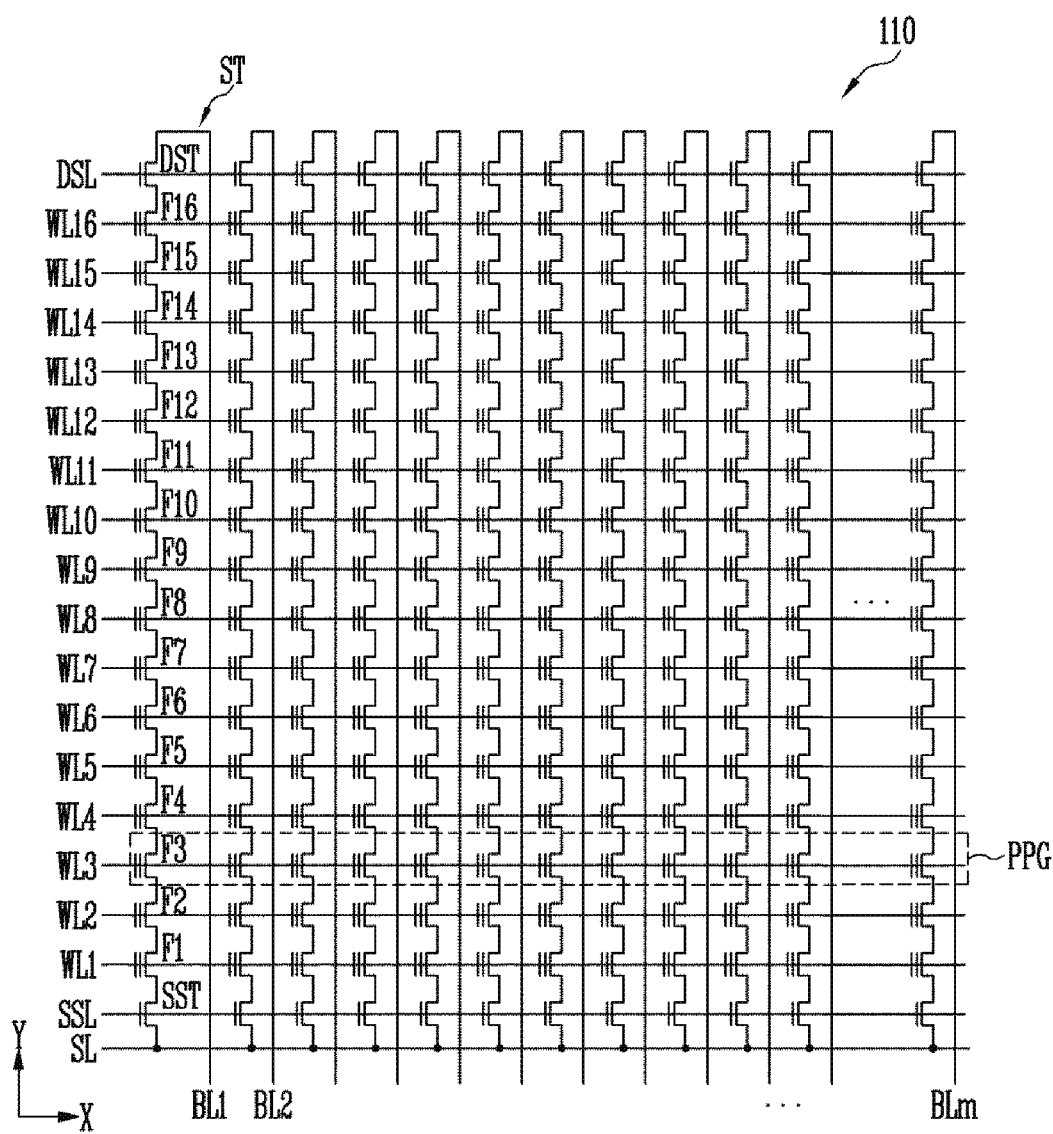
FIG. 3 is a diagram illustrating a memory block shown in FIG. 2.

FIG. 3 is a diagram illustrating the memory block 110 shown in FIG. 2.

Referring to FIG. 3, the memory block 110 may be configured such that a plurality of word lines arranged in parallel with each other may be coupled between a first select line and a second select line. The first select line may be a source select line SSL and the second select line may be a drain select line DSL. For example, the memory block 110 may include a plurality of strings ST coupled between the bit lines BL1 to BLm and the source line SL. The bit lines BL1 to BLm may be coupled to the strings ST, respectively, and the source line SL may be commonly coupled to the strings ST. Because the strings ST may have the same configuration, the string ST coupled to the first bit line BL1 is described as an example.

The string ST may include a source select transistor SST, a plurality of memory cells F1 to F16, and a drain select transistor DST coupled in series between the source line SL and the first bit line BL1. The single string ST may include at least one source select transistor SST and at least one drain select transistor DST, and may include more memory cells than the memory cells F1 to F16 shown in FIG. 3.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16, respectively. A group of memory cells coupled to the same word line, among memory cells included in the different strings ST, may be referred to as a page PPG. Therefore, the memory block 110 may include as many pages PPG as the number of word lines WL1 to WL16.

Figure 4:
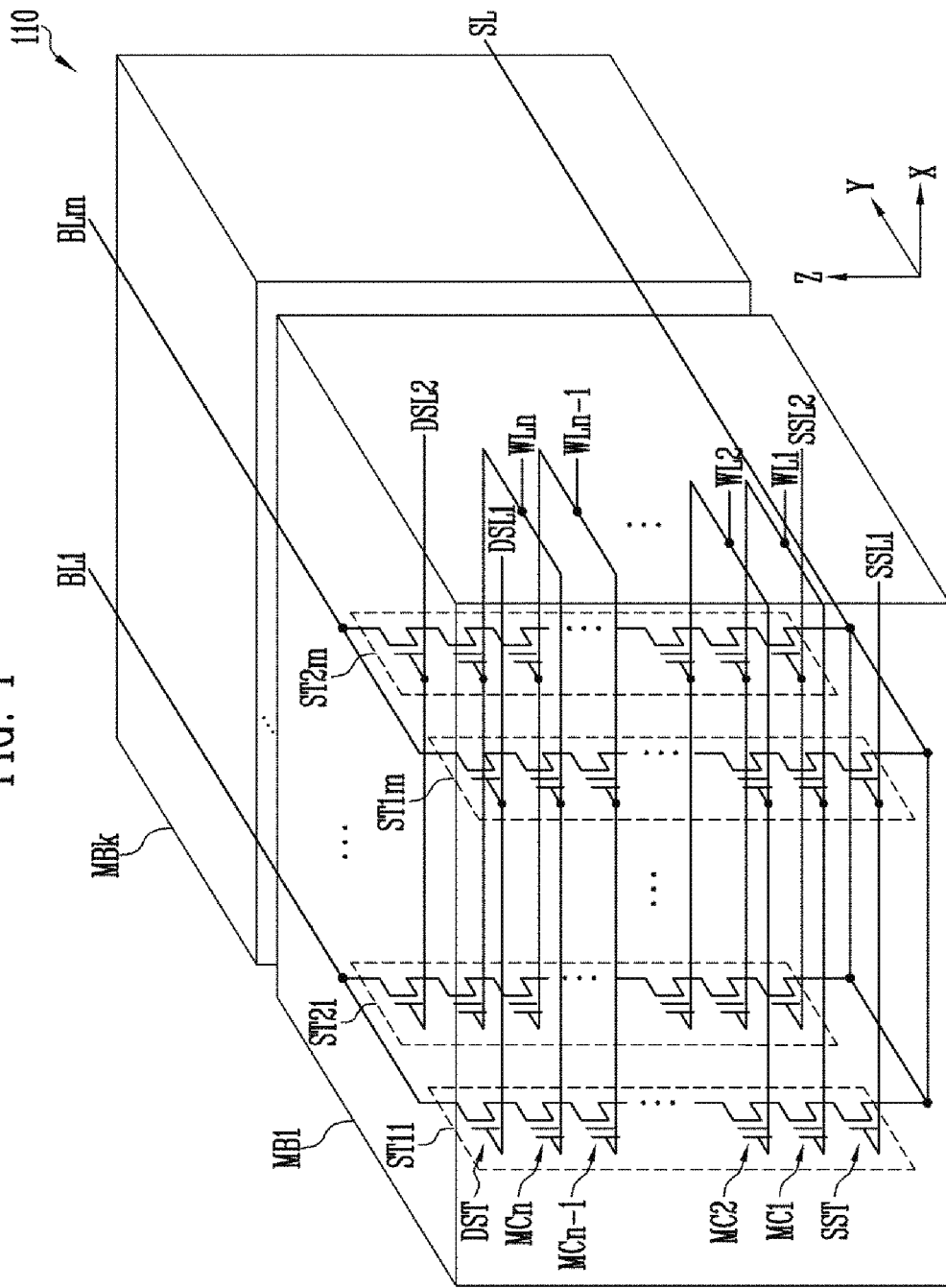
FIG. 4 is a diagram illustrating an embodiment of a three-dimensionally structured memory block.

FIG. 4 is a diagram illustrating an embodiment of the three-dimensionally structured memory block 110.

Referring to FIG. 4, the memory cell array 100 may include the plurality of memory blocks (MB1 to MBk) 110. The memory block 110 may include a plurality of strings ST11 to ST1$m$ and ST21 to ST2$m$. According to an embodiment, each of the plurality of strings ST11 to ST1$m$ and ST21 to ST2$m$ may have an shape or a 'U' shape. In the first memory block MB1, m strings may be arranged in a row direction (X direction). For convenience of explanation, FIG. 4 illustrates two strings arranged in a column direction (V direction). However, three or more strings may be arranged in the column direction (Y direction).

Each of the plurality of strings ST11 to ST1$m$ and ST21 to ST2$m$ may include at least one source select transistor SST, first to nth memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. Source select transistors of the strings ST11 to ST1$m$ arranged in the first row may be coupled to a first source select line SSL1. Source select transistors of the strings ST21 to ST2$m$ arranged in the second row may be coupled to a second source select line SSL2. According to another embodiment, source select transistors of the strings ST11 to ST1m and ST21 to ST2m may be coupled in common to a single source select line.

The first to nth memory cells MC1 to MCn of each string may be coupled in series between the source select transistor SST and the drain select transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When a dummy memory cell is provided, a voltage or current of the corresponding string may be stably controlled. Accordingly, the reliability of data stored in the memory block 110 may be improved.

The drain select transistor DST of each string may be coupled between the bit line and the memory cells MC1 to MCn. The drain select transistors DST of the strings arranged in the row direction may be coupled to a drain select line extending in the row direction. The drain select transistors DST of the strings ST11 to ST1m in the first row may be coupled to a first drain select line DSL1. The drain select transistors DST of the strings ST21 to ST2m in the second row may be coupled to a second drain select line DSL2.

Figure 5:
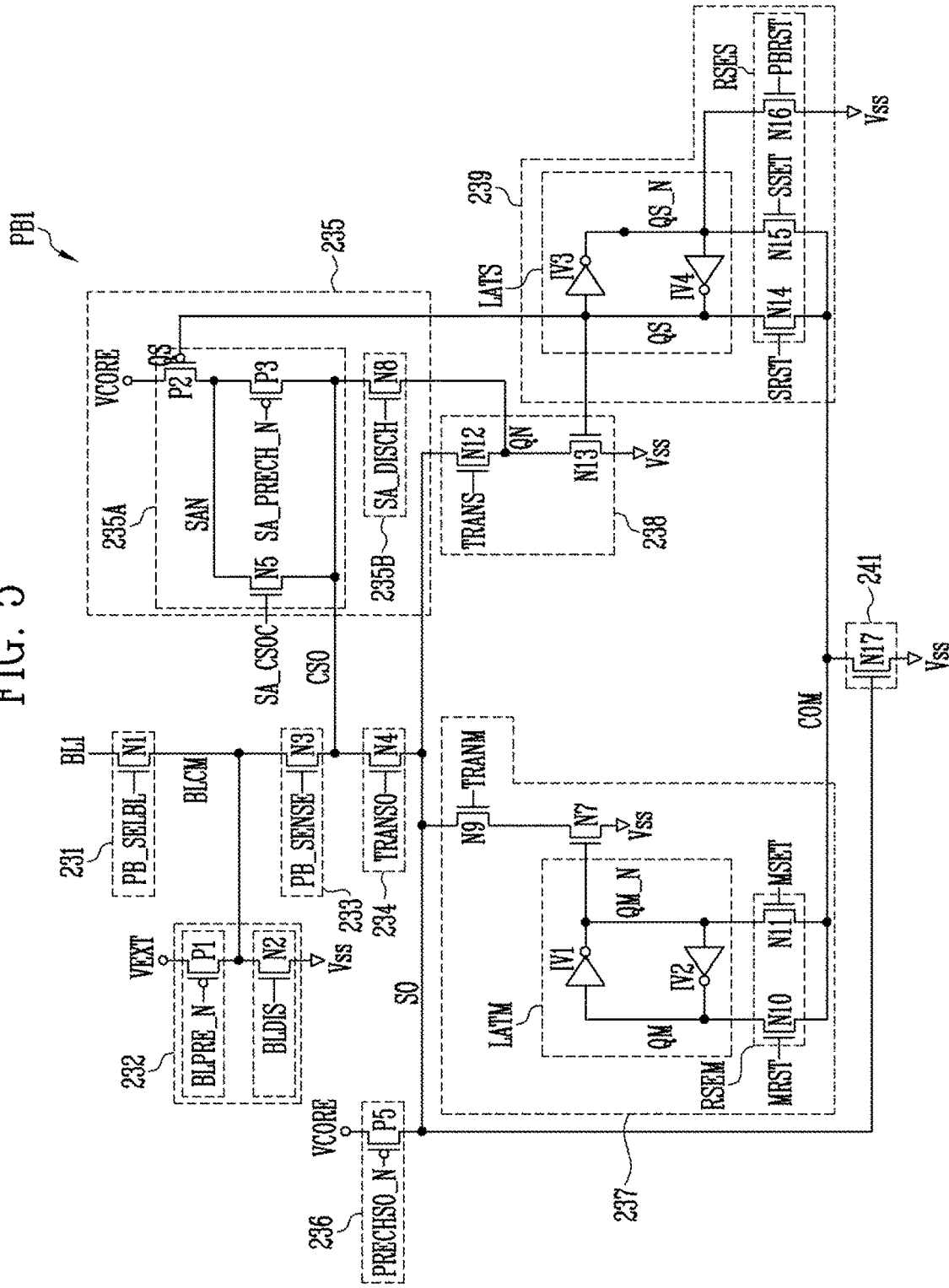
FIG. 5 is a diagram illustrating a page buffer shown in FIG. 2.

FIG. 5 is a diagram illustrating the page buffer shown in FIG. 2.

Because the plurality of page buffers PB1 to PBm may be configured in similar manners, one of the page buffers (PB1) is described as an example.

Referring to FIG. 5, the page buffer PB1 may include a bit line coupling circuit 231, a bit line set-up circuit 232, a page buffer sensing circuit 233, a sensing node coupling circuit 234, a current control circuit 235, a sensing node precharge circuit 236, a main latch 237, a first discharge circuit 238, a sub-latch 239, and a second discharge circuit 241.

The bit line coupling circuit 231 may be coupled between the bit line BL1 and a bit line coupling node BLCM and may include an NMOS transistor N1 operating in response to a bit line select signal PB_SELBL. The NMOS transistor N1 may be turned on or off in response to the bit line select signal PB_SELBL.

The bit line set-up circuit 232 may be coupled between a power voltage VEXT terminal, ground power Vss, and the bit line coupling node BLCM, and may include an NMOS transistor N2 operating in response to a bit line discharge signal BLDIS, and a PMOS transistor P1 operating in response to a bit line precharge signal BLPRE_N. The NMOS transistor N2 may be turned on or off in response to the bit line discharge signal BLDIS and may apply the ground power Vss to the bit line coupling node BLCM. The PMOS transistor P1 may apply the power voltage VEXT to the bit line coupling node BLCM in response to the bit line precharge signal BLPRE_N.

The page buffer sensing circuit 233 may be coupled between the bit line coupling node BLCM and a current sensing node CSO and may include an NMOS transistor N3 operating in response to a page buffer sensing signal PB_SENSE. The NMOS transistor N3 may be turned on or off in response to the page buffer sensing signal PB_SENSE.

The sensing node coupling circuit 234 may be coupled between the current sensing node CSO and a sensing node SO and may include an NMOS transistor N4 operating in response to a node coupling signal TRANSO. The NMOS transistor N4 may be turned on or off in response to the node coupling signal TRANSO.

The current control circuit 235 may include a clamp circuit 235A and a sensing discharge circuit 235B.

The clamp circuit 235A may include an NMOS transistor N5 and PMOS transistors P2 and P3. The PMOS transistor P2 may be coupled between a core voltage VCORE terminal and a sense amplifier node SAN and may be turned on or off in response to a potential of a second sub-node QS of the sub-latch 239. The PMOS transistor P3 may be coupled between the sense amplifier node SAN and the current sensing node CSO and may be turned on or off in response to an internal sensing node precharge signal SA_PRECH_N. The NMOS transistor N5 may be coupled between the sense amplifier node SAN and the current sensing node CSO and may apply a sensing current to sense the bit line BEA to the current sensing node CSO in response to a current sensing signal SA_CSOC.

The sensing discharge circuit 235B may be coupled between the current sensing node CSO and a node QN of the first discharge circuit 238 and may include an NMOS transistor N8 operating in response to an internal sensing node discharge signal SA_DISCH. The NMOS transistor N8 may be turned on or off in response to the internal sensing node discharge signal SA_DISCH.

The sensing node precharge circuit 236 may be coupled between the core voltage VCORE terminal and the sensing node SO and may include a PMOS transistor P5 operating in response to a precharge signal PRECHSO_N. The PMOS transistor P5 may supply the core voltage VCORE to the sensing node SO in response to the precharge signal PRECHSO_N.

The main latch 237 may include an NMOS transistor N7, an NMOS transistor N9, a latch LATM, and a main latch reset/setup circuit RSEM. The main latch 237 may temporarily store data sensed during a read operation.

The latch LATM may include inverters IV1 and IV2. The inverters IV1 and IV2 may be coupled in anti-parallel with each other between first and second main nodes QM_N and QM of the latch LATM. An input terminal of the inverter IV1 may be coupled to the second main node QM and an output terminal of the inverter IV1 may be coupled to the first main node QM_N. An input terminal of the inverter IV2 may be coupled to the first main node QM_N and an output terminal of the inverter IV2 may be coupled to the second main node QM.

The NMOS transistor N9 and the NMOS transistor N7 may be coupled in series between the sensing node SO and the ground power Vss and may apply or block the ground power Vss to the sensing node SO in response to a main data transmission signal TRANM and a potential of the first main node QM_N. The NMOS transistor N9 may be turned on or off in response to the main data transmission signal TRANM, and the NMOS transistor N7 may be turned on or off in response to a potential of the first main node QM_N.

The main latch reset/setup circuit RSEM may be coupled to the first and second main nodes QM_N and QM of the latch LATM and may reset or set up the latch LATM. The main latch reset/setup circuit RSEM may include NMOS transistors N10 and N11. The NMOS transistor N10 may couple the second main node QM of the latch LATM to the common node COM in response to a main reset signal MRST. The NMOS transistor N11 may couple the first main node QM_N of the latch LATM to the common node COM in response to a main setup signal MSET. The main latch reset/setup circuit RSEM may couple the common node COM to the second main node QM in response to the main reset signal MRST to initialize the latch LATM such that the second main node QM reaches a low level during an initialization operation of the latch LATM and may control the first main node QM_N to reach a low level or a high level according to a potential of the common node COM which is determined according to a sensed data value in response to the main setup signal MSET during a sensing operation of the latch LATM.

The first discharge circuit 238 may include NMOS transistors N12 and N13 coupled in series between the sensing node SO and the ground power Vss. The NMOS transistor N12 may be turned on or off in response to a transmission signal TRANS and the NMOS transistor N13 may be turned on or off in response to a potential of a second sub-node QS of the sub-latch 239.

The sub-latch 239 may include a latch LATS and a sub-latch reset/setup circuit RSES.

The latch LATS may include inverters IV3 and IV4. The inverters IV3 and IV4 may be coupled in anti-parallel with each other between a first sub-node QS_N and the second sub-node QS of the latch LATS. For example, an input terminal of the inverter IV3 may be coupled to the second sub-node QS and an output terminal of the inverter IV3 may be coupled to the first sub-node QS_N. An input terminal of the inverter IV4 may be coupled to the first sub-node QS_N and an output terminal of the inverter IV4 may be coupled to the second sub-node QS.

The sub-latch reset/setup circuit RSES may be coupled to the first sub-node QS_N and the second sub-node QS and may reset or set up the latch LATS. The sub-latch reset/setup circuit RSES may include NMOS transistors N14, N15 and N16. The NMOS transistor N14 may couple the second sub-node QS of the latch LATS to the common node COM in response to a sub-reset signal SRST. The NMOS transistor N15 may couple the first sub-node QS_N of the latch LATS to the common node COM in response to a sub-setup signal SSET. When a reset operation or a setup operation of the latch LATS is performed, the ground power Vss may be coupled to the common node COM. The NMOS transistor N16 may be coupled between the first sub-node QS_N and a terminal of the ground power Vss and may be turned on in response to a reset signal PBRST.

The second discharge circuit 241 may include a NMOS transistor N17 that is coupled between the common node COM and a terminal of the ground power Vss and is turned on or off in response to a potential of the sensing node SO.

Figure 6:
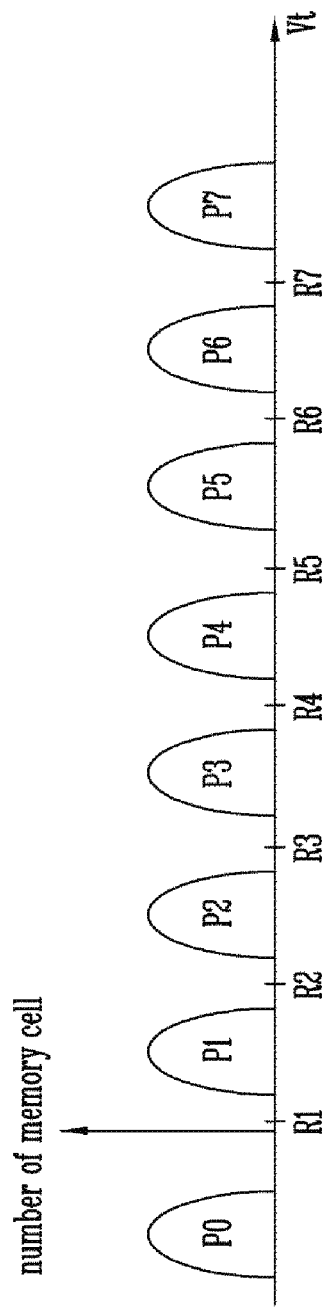
FIG. 6 is a diagram illustrating a threshold voltage distribution of memory cells.

FIG. 6 is a diagram illustrating a threshold voltage distribution of memory cells.

Referring to FIG. 6, a plurality of memory cells included in the single page PPG of FIG. 3 may have a threshold voltage distribution corresponding to a plurality of program states when a program operation is performed.

For example, when the plurality of memory cells are programmed by a Triple Level Cell (TLC) method, the plurality of memory cells may have a threshold voltage distribution corresponding to an erase state PO and first to seventh program states P1 to P7. The memory cells programmed by the TLC method may sense a corresponding program state by using a plurality of read voltages R1 to R7 during a read operation. For example, when a threshold voltage of a target memory cell is greater than the third read voltage R3 according to a result of a read operation using the third read voltage R3, and when the threshold voltage Vt of the target memory cell is smaller than the fourth read voltage R4 according to a result of a read operation using the fourth read voltage R4, it is sensed that the target memory cell corresponds to the third program state, therefore, data corresponding to the third program state may be read.

Figure 7:
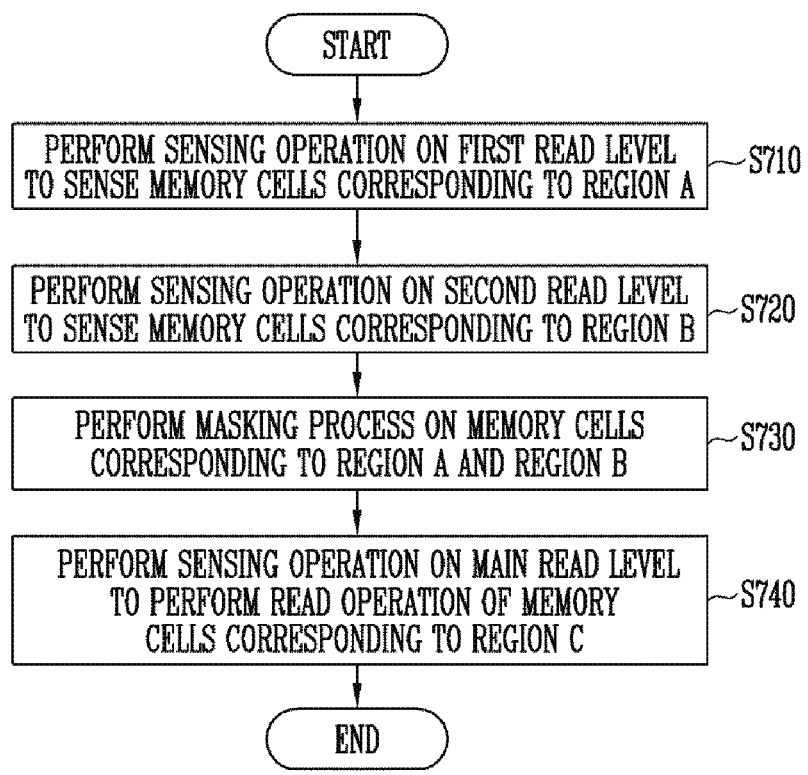
FIG. 7 is a flowchart illustrating a method of operating a memory device according to an embodiment.

FIG. 7 is a flowchart illustrating a method of operating a memory device according to an embodiment.

Figure 8:
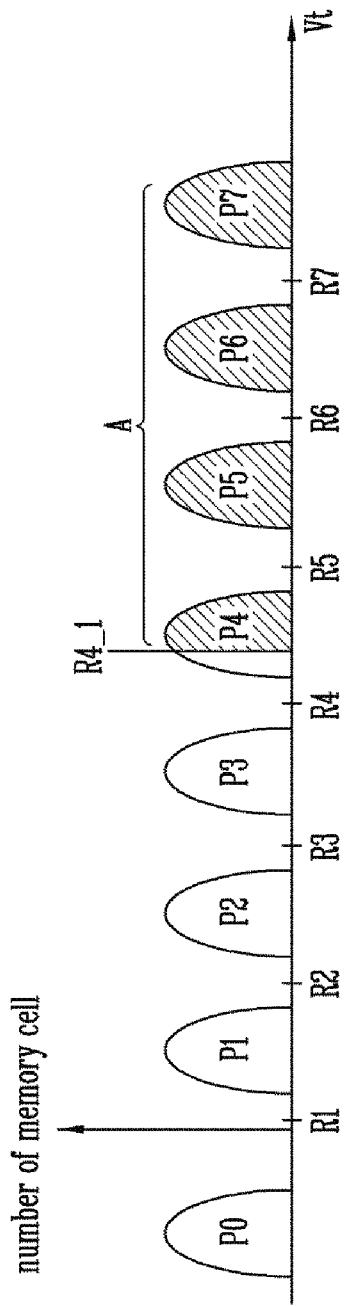
FIGS. 8, 9 and 10 are distribution charts of a threshold voltage illustrating a method of operating a memory device according to an embodiment.
Figure 9:
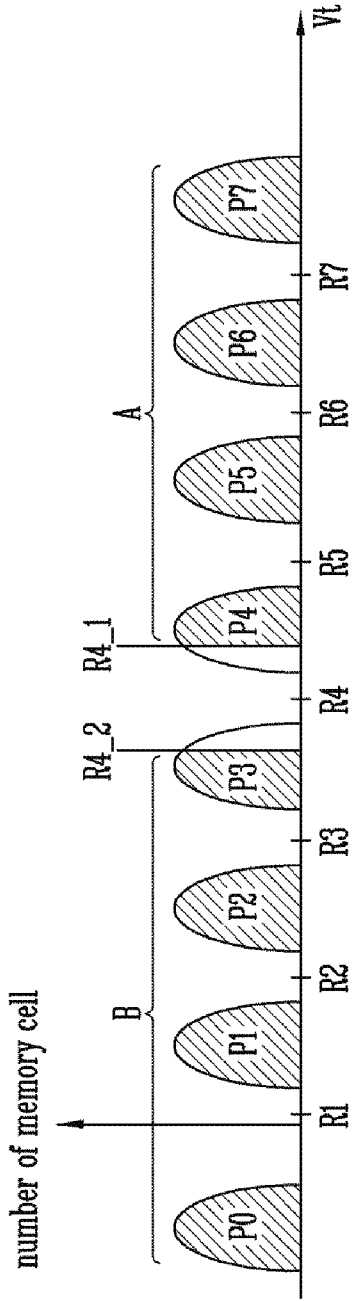
Figure 10:
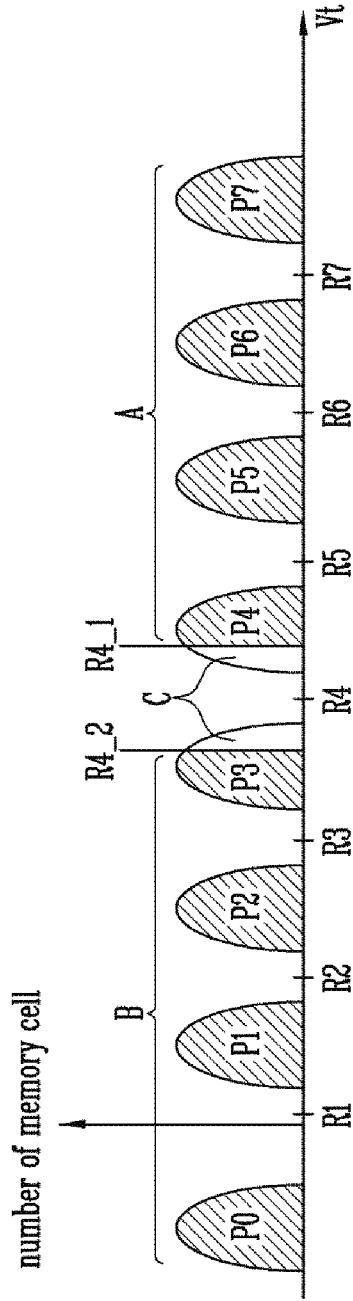

FIGS. 8 to 10 are distribution charts of a threshold voltage illustrating a method of operating a memory device according to an embodiment.

A method of performing a read operation of a memory device according to an embodiment is described below with reference to FIGS. 2 and 7 to 10.

In an embodiment, a read operation using the fourth read voltage R4 among the read operations using the read voltage is described as an example. In this example, the fourth read voltage R4 may be, for example, a main read level.

During the read operation, the control logic 300 of the memory device may control the peripheral circuit 200 to perform a sensing operation pertaining to a first read level R4_1 higher than a level of the fourth read voltage R4 to sense memory cells corresponding to a region A as shown in FIG. 8 (S710). A sensing result may be stored in the page buffers PB1 to PBm of the page buffer group 230.

In other words, the memory cells having a threshold voltage that have a level that is higher than or equal to the first read level R4_1 higher than the level of the fourth read voltage R4, i.e., a main read level, may be sensed. In an embodiment, the region A may correspond to the memory cells having a threshold voltage that have a level that is higher than or equal to the first read level R4_1 higher than the level of the fourth read voltage R4.

The control logic 300 of the memory device may control the peripheral circuit 200 to perform a sensing operation pertaining to a second read level R4_2 lower than the level of the fourth read voltage R4 to sense memory cells corresponding to a region B as shown in FIG. 9 (S720). A sensing result may be stored in the page buffers PB1 to PBm of the page buffer group 230.

In other words, the memory cells having a threshold voltage that have a level that is lower than or equal to the second read level R4_2 lower than the level of the fourth read voltage R4, i.e., the main read level, may be sensed. In an embodiment, the region B may correspond to the memory cells having a threshold voltage that have a level that is lower than or equal to the second read level R4_2 lower than the level of the fourth read voltage R4.

According to an embodiment, it is described that step S720 is performed after step S710 is performed. Alternatively, however, step S710 may be performed after step S720 is performed.

A masking process may be performed on the memory cells corresponding to the region A and the region B, which are sensed according to the sensing results of step S710 and step S720, respectively (S730). The masking process may control bit lines coupled to the memory cells corresponding to the region A and the region B to have a ground level during a sensing operation pertaining to the main read level subsequent to the masking process.

The page buffers PB1 to PBm of the page buffer group 230 may control the bit lines, which are coupled to the memory cells corresponding to the region A and the region B, to have the ground level during the sensing operation pertaining to the main read level according to the sensing results of step S710 and step S720.

Subsequently, a sensing operation pertaining to the main read level may be performed to perform a read operation of memory cells corresponding to a region C (S740). In other words, among the memory cells corresponding to the region C, memory cells having a threshold voltage greater than or equal to the fourth read voltage R4, i.e., the main read level, and memory cells having a threshold voltage smaller than or equal to the fourth read voltage R4 may be sensed and a sensing result may be stored in the page buffer group 230.

Referring to FIG. 10, a sensing operation may be performed pertaining to the main read level with respect to the memory cells corresponding to the region C, other than the memory cells corresponding to the region A and having the threshold voltage level which is higher than or equal to the first read level R4_1 and the memory cells corresponding to the region B and having the threshold voltage level which is lower than or equal to the second read level R4_2.

The page buffer group 230 may temporarily store read data based on the result of the sensing operation pertaining to the first read voltage level and the result of the sensing operation pertaining to the main read level and may output the temporarily stored read data.

Because the bit lines coupled to the memory cells corresponding to the region A and the region B have a ground level by the page buffer group 230 during the sensing operation pertaining to the main read level, a probability that bit lines adjacent to bit lines coupled to the memory cells corresponding to the region C, during the sensing operation pertaining to the memory cells corresponding to the region C, have a ground level may be high. Accordingly, noise caused by a bit line coupling phenomenon may be prevented or lessened during the sensing operation pertaining to the main read level.

Figure 11:
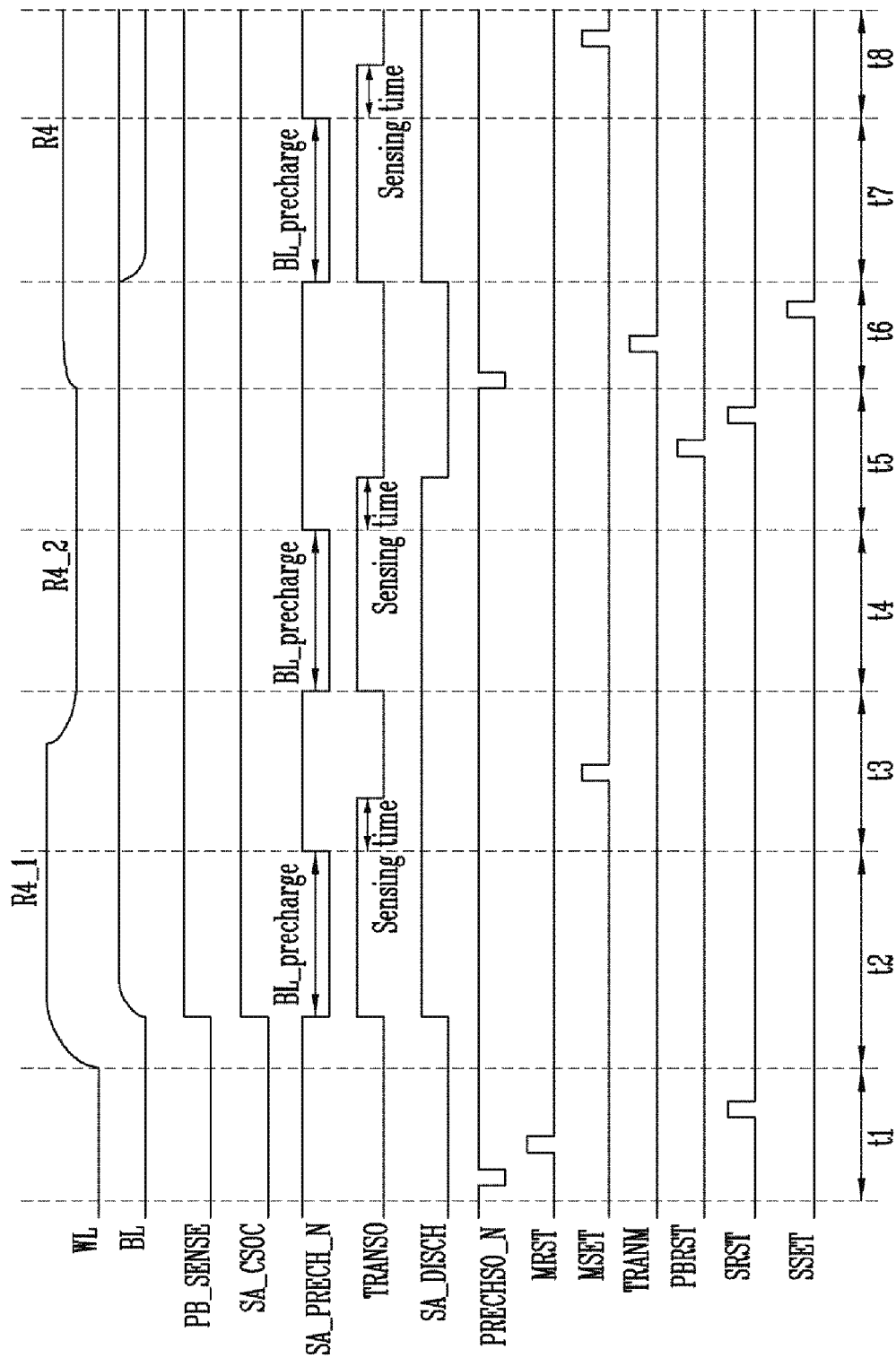
FIG. 11 is a waveform diagram of signals illustrating an operation of a page buffer according to an embodiment.

FIG. 11 is a waveform diagram of signals illustrating an operation of a page buffer according to an embodiment.

An operation of a page buffer according to an embodiment is described below with reference to FIGS. 5 and 8 to 11. When a read operation is performed, a plurality of page buffers operate in a similar manner. Accordingly, the page buffer PB1 is described as an example.

In an embodiment, a read operation using the fourth read voltage R4 among the read operations using a plurality of read voltages is described as an example.

The page buffer PB1 may perform an initialization operation during a period t1. For example, the PMOS transistor P5 may be turned on in response to the precharge signal PRECHSO_N to apply the core voltage VCORE to the sensing node SO. Accordingly, the NMOS transistor N17 of the second discharge circuit 241 may be turned on to apply the ground power Vss to the common node COM. Subsequently, the main reset signal MRST having a high level may be applied to the main latch reset/setup circuit RSEM to initialize the second main node QM of the latch LATM to a low level. In addition, the sub-reset signal SRST having a high level may be applied to the sub-latch reset/setup circuit RSES to initialize the second sub-node QS of the latch LATS to a low level.

The first read level voltage R4_1 may be applied to the word line WL corresponding to a selected page during a period t2. The first read level voltage R4_1 may correspond to the first read level R4_1 shown in FIG. 8.

The PMOS transistor P2 of the clamp circuit 235A may be turned on in response to a potential of the second sub-node QS, and the PMOS transistor P3 of the clamp circuit 235A may be turned on in response to the internal sensing node precharge signal SA_PRECH_N to apply the core voltage VCORE to the current sensing node CSO. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied. Accordingly, the bit line BL1 may be precharged to a predetermined level. The word "predetermined" as used herein with respect to a parameter, such as a predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PMOS transistor P3 may be turned off in response to the internal sensing node precharge signal SA_PRECH_N during a period t3. Accordingly, a cell current of the bit line BL1 may vary according to a threshold voltage of a memory cell coupled to the bit line BL1. The NMOS transistor N4 may maintain a turn-on state during a sensing time Sensing time of the period t3 and may then be turned off in response to the node coupling signal TRANSO. Accordingly, a potential level of the sensing node SO may be maintained at a high level or may be discharged to a low level according to a cell current of the bit line BL1. Subsequently, the main setup signal MSET having a high level may be applied to the main latch reset/setup circuit RSEM, such that the first main node QM_N of the latch LATM maintains a high level or is set up to have a low level. In other words, when a threshold voltage of a memory cell coupled to the bit line BL1 is greater than the first read level voltage R4_1, the first main node QM_N may maintain a high level, and when the threshold voltage of the memory cell coupled to the bit line BL1 is smaller than the first read level voltage R4_1, the first main node QM_N may be set up to have a low level.

The second read level voltage R4_2 may be applied to the word line WL corresponding to the selected page during a period t4. The second read level voltage R4_2 may correspond to the second read level R4_2 shown in FIG. 9.

The PMOS transistor P2 of the clamp circuit 235A may be turned on in response to a potential of the second sub-node QS, and the PMOS transistor P3 of the clamp circuit 235A may be turned on in response to the internal sensing node precharge signal SA_PRECH_N to apply the core voltage VCORE to the current sensing node CSO. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied. Accordingly, the bit line BL1 may be precharged to a predetermined level.

The PMOS transistor P3 may be turned off in response to the internal sensing node precharge signal SA_PRECH_N during a period t5. Accordingly, a cell current of the bit line BL1 may vary according to a threshold voltage of a memory cell coupled to the bit line BL1. The NMOS transistor N4 may maintain a turn-on state during the sensing time Sensing time of the period t5 and may then be turned off in response to the node coupling signal TRANSO. Accordingly, a potential level of the sensing node SO may be maintained at a high level or may be discharged to a low level according to the cell current of the bit line BL1. The reset signal PBRST having a high level may be applied to the sub-latch reset/setup circuit RSES to set the first sub-node QS_N of the latch LATS to a low level. Subsequently, the sub-reset signal SRST having a high level may be applied to the sub-latch reset/setup circuit RSES, such that the second sub-node QS of the latch LATS maintains a high level or is set up to have a low level. In other words, when a threshold voltage of a memory cell coupled to the bit line BL1 is greater than the second read level voltage R4_2, the second sub-node QS may be set up to have a low level, and when the threshold voltage of the memory cell coupled to the bit line BL1 is smaller than the second read level voltage R4_2, the second sub-node QS may maintain a high level.

Sensing data stored in the latch LATM may be transmitted to the latch LATS during a period t6. Accordingly, data based on the sensing data that is sensed during the period t5 and the sensing data that is sensed during the period t3 may be newly stored in the latch LATS. For example, the PMOS transistor P5 may be turned on in response to the precharge signal PRECHSO_N to apply the power voltage VEXT to the sensing node SO. Accordingly, the sensing node OS may be precharged to a predetermined level. Subsequently, when the NMOS transistor N9 is turned on in response to the main data transmission signal TRANM, a potential level of the sensing node SO may be maintained at the precharged level or may be discharged to a low level according to a potential level of the first main node QM_N. Subsequently, the sub-setup signal SSET having a high level may be applied to the sub-latch reset/setup circuit RSES, such that the second sub-node QS of the latch LATS maintains a previous level or is set up to have a high level.

For example, when a level of a threshold voltage of a memory cell is higher than the first read level R4_1, sensing data stored in the latch LATM may be transmitted to the latch LATS and the second sub-node QS of the latch LATS may be set to have a high level. In addition, when the level of the threshold voltage of the memory cell is lower than the second read level R4_2, sensing data stored in the latch LATS may be maintained and the second sub-node QS may maintain a high level. Alternatively, when a level of a threshold voltage of a memory cell is lower than the first read level R4_1 and is higher than the second read level R4_2, the second sub-node QS may be set to have a low level.

The main read level voltage R4 may be applied to the word line WL corresponding to the selected page during a period t7. The main read level voltage R4 may correspond to the main read level shown in FIG. 8.

The PMOS transistor P2 of the clamp circuit 235A may be turned on or off in response to a potential of the second sub-node QS. For example, when a level of a threshold voltage of a memory cell is higher than the first read level R4_1 or lower than the second read level R4_2 during a previous sensing operation, because a potential of the second sub-node QS is a high level, the PMOS transistor P2 may be turned off. Accordingly, a precharge operation of the bit line BL1 is not performed, therefore, a potential of the bit line BL1 may become a ground level GND.

Alternatively, when a level of a threshold voltage of a memory cell is lower than the first read level R4_1 and higher than the second read level R4_2 during a previous sensing operation, because a potential of the second sub-node QS has a low level, the PMOS transistor P2 may be turned on. Accordingly, the bit line BL1 may be precharged to a predetermined level.

When a precharge operation of the bit line BL1 was not performed during the previous period, that is, the period t7, and the potential of the bit line BL1 became the ground level GND, even when a sensing operation on the main read level is performed during a period t8, sensed data may be maintained in the latch LATM without change. In other words, when a level of a threshold voltage of a memory cell coupled to the bit line BL1 is higher than the first read level R4_1, the first main node QM_N may maintain a low level, and when the level of the threshold voltage of the memory cell coupled to the bit line BL1 is lower than the second read level R4_2, the first main node QM_N may maintain a high level.

Alternatively, when the precharge operation of the bit line BL1 was performed during the period t7, the PMOS transistor P3 may be turned off in response to the internal sensing node precharge signal SA_PRECH_N during the period t8. Accordingly, a cell current of the bit line BL1 may vary according to a threshold voltage of a memory cell coupled to the bit line BL1. The NMOS transistor N4 may maintain a turn-on state during the sensing time Sensing time of the period t8 and may then be turned off in response to the node coupling signal TRANSO. Accordingly, a potential of the sensing node SO may be maintained at a high level or may be discharged to a low level according to a cell current of the bit line BL1. Subsequently, the main setup signal MSET having a high level may be applied to the main latch reset/setup circuit RSEM, such that the first main node QM_N of the latch LATM maintains a high level or is set up to have a low level. In other words, when a level of a threshold voltage of a memory cell coupled to the bit line BL1 is higher than the main read level R4, the first main node QM_N may be set up to have a low level, and when the level of the threshold voltage of the memory cell coupled to the bit line BL1 is lower than the main read level R4, the first main node QM_N may maintain a high level.

As described above, according to an embodiment, a sensing operation performed by applying the main read voltage R4 may be performed after a masking process is performed on bit lines of memory cells corresponding to the region A and the region B according to sensing results of a sensing operation performed by applying the first read level voltage R4_1 greater than the main read voltage R4 to a word line and a sensing operation performed by applying the second read level voltage R4_2 smaller than the main read voltage R4 to the word line.

Figure 12:
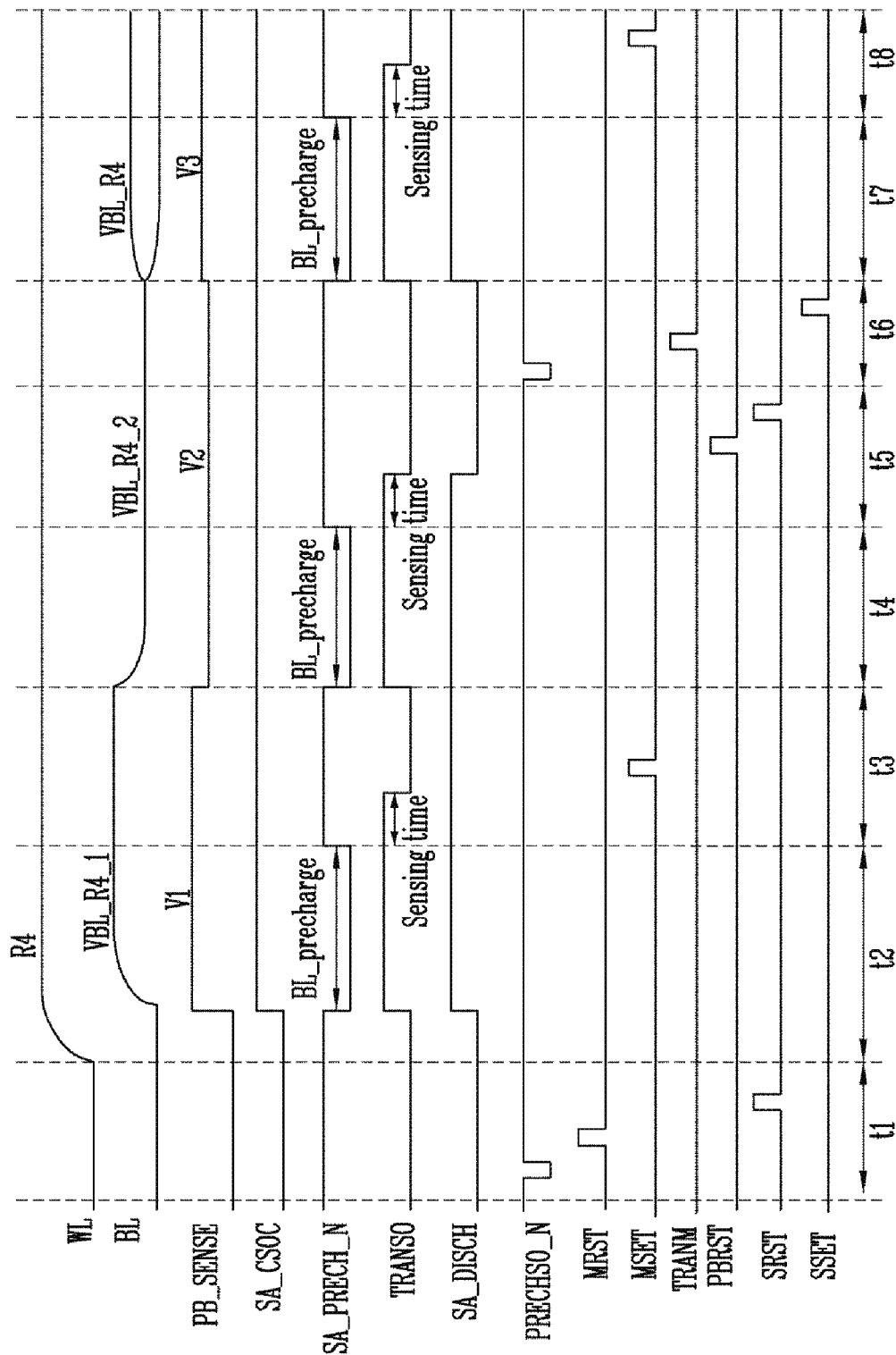
FIG. 12 is a waveform diagram of signals illustrating an operation of a page buffer according to another embodiment.

FIG. 12 is a waveform of signals illustrating an operation of a page buffer according to another embodiment.

An operation of a page buffer according to another embodiment is described below with reference to FIGS. 5, 8 to 10, and 12. When a read operation is performed, a plurality of page buffers operate in a similar manner. Accordingly, the page buffer PB1 is described as an example.

In another embodiment, a read operation using the fourth read voltage R4 among the read operations using a plurality of read voltages is described as an example.

The page buffer PB1 may perform an initialization operation during the period t1. For example, the PMOS transistor P5 may be turned on in response to the precharge signal PRECHSO_N to apply the power voltage VEXT to the sensing node SO. Accordingly, the NMOS transistor N17 of the second discharge circuit 241 may be turned on to apply the ground power Vss to the common node COM. Subsequently, the main reset signal MRST having a high level may be applied to the main latch reset/setup circuit RSEM to initialize the second main node QM of the latch LATM to a low level. In addition, the sub-reset signal SRST having a high level may be applied to the sub-latch reset/setup circuit RSES to initialize the second sub-node QS of the latch LATS to a low level.

The main read voltage R4 corresponding to a main read level may be applied to the word line WL corresponding to the selected page during the period t2.

The PMOS transistor P2 of the clamp circuit 235A may be turned on in response to a potential of the second sub-node QS, and the PMOS transistor P3 of the clamp circuit 235A may be turned on in response to the internal sensing node precharge signal SA_PRECH_N to apply the core voltage VCORE to the current sensing node CSO. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied. The page buffer sensing signal PB_SENSE may be a first voltage V1. Accordingly, the bit line BL1 may be precharged to a potential of a first bit line voltage VBL_R4_1. The first bit line voltage VBL_R4_1 may correspond to the first read level R4_1 shown in FIG. 8.

The PMOS transistor P3 may be turned off in response to the internal sensing node precharge signal SA_PRECH_N during the period t3. Accordingly, a cell current of the bit line BL1 may vary according to a threshold voltage of a memory cell coupled to the bit line BL1. The cell current of the bit line BL1 may be affected by a precharge level of the bit line BL1. For example, when a precharge level of a bit line is high in a state where the same read voltage is applied to a word line, a cell current may be increased and have an effect of increasing a read level. In other words, when a sensing operation is performed by adjusting the precharge level of the bit line BL1 to a potential of the first bit line voltage VBL_R4_1 in a state where the fourth read voltage R4 is applied to the word line, a sensing result with respect to the first read level R4_1 may be obtained. The NMOS transistor N4 may maintain a turn-on state during the sensing time Sensing time of the period t3 and may then be turned off in response to the node coupling signal TRANSO. Accordingly, a potential level of the sensing node SO may be maintained at a high level or may be discharged to a low level according to a cell current of the bit line BL1. Subsequently, the main setup signal MSET having a high level may be applied to the main latch reset/setup circuit RSEM, such that the first main node QM_N of the latch LATM maintains a high level or is set up to have a low level. In other words, when a threshold voltage of a memory cell coupled to the bit line BL1 is greater than the first read level voltage R4_1, the first main node QM_N may maintain a high level, and when the threshold voltage of the memory cell coupled to the bit line BL1 is smaller than the first read level voltage R4_1, the first main node QM_N may be set up to have a low level.

The PMOS transistor P2 of the clamp circuit 235A may be turned on in response to a potential of the second sub-node QS, and the PMOS transistor P3 of the clamp circuit 235A may be turned on in response to the internal sensing node precharge signal SA_PRECH_N to apply the core voltage VCORE to the current sensing node CSO during the period t4. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied. The page buffer sensing signal PB_SENSE may be a second voltage V2. The second voltage V2 may be lower than the first voltage V1. Accordingly, the bit line BL1 may be precharged to a potential of a second bit line voltage VBL_R4_2. The second bit line voltage VBL_R4_2 may correspond to the second read level R4_2 shown in FIG. 9.

The PMOS transistor P3 may be turned off in response to the internal sensing node precharge signal SA_PRECH_N during the period t5. Accordingly, a cell current of the bit line BL1 may vary according to a threshold voltage of a memory cell coupled to the bit line BL1. The cell current of the bit line BL1 may be affected by a precharge level of the bit line BL1. In other words, when a sensing operation is performed by adjusting the precharge level of the bit line BL1 to a potential of the second bit line voltage VBL_R4_2 in a state where the fourth read voltage R4 is applied to the word line, a sensing result with respect to the second read level R4_2 may be obtained. The NMOS transistor N4 may maintain a turn-on state during the sensing time Sensing time of the period t5 and may then be turned off in response to the node coupling signal TRANSO. Accordingly, a potential level of the sensing node SO may be maintained at a high level or may be discharged to a low level according to a cell current of the bit line BL1. The reset signal PBRST having a high level may be applied to the sub-latch reset/setup circuit RSES to set the first sub-node QS_N of the latch LATS to a low level. Subsequently, the sub-reset signal SRST having a high level may be applied to the sub-latch reset/setup circuit RSES, such that the second sub-node QS of the latch LATS maintains a high level or is set up to have a low level. In other words, when a threshold voltage of a memory cell coupled to the bit line BL1 is greater than the second read level voltage R4_2, the second sub-node QS may be set up to have a low level, and when the threshold voltage of the memory cell coupled to the bit line BL1 is smaller than the second read level voltage R4_2, the second sub-node QS may maintain a high level.

Sensing data stored in the latch LATM may be transmitted to the latch LATS during the period t6. Accordingly, data based on the sensing data that is sensed during the period t5 and the sensing data that is sensed during the period t3 may be newly stored in the latch LATS. For example, the PMOS transistor P5 may be turned on in response to the precharge signal PRECHSO_N to apply the power voltage VEXT to the sensing node SO. Accordingly, the sensing node SO may be precharged to a predetermined level. Subsequently, when the NMOS transistor N9 is turned on in response to the main data transmission signal TRANM, a potential level of the sensing node SO may be maintained at a precharge level or may be discharged to a low level according to a potential level of the first main node QM_N. Subsequently, the sub-setup signal SSET having a high level may be applied to the sub-latch reset/setup circuit RSES, such that the second sub-node QS of the latch LATS maintains a previous level or is set up to have a high level.

For example, when a threshold voltage of a memory cell is greater than the first read level R4_1, sensing data stored in the latch LATM may be transmitted to the latch LATS and the second sub-node QS of the latch LATS may become a high level. In addition, when the threshold voltage of the memory cell is smaller than the second read level sensing data stored in the latch LATS may be maintained and the second sub-node QS may maintain a high level. Alternatively, when a threshold voltage of a memory cell is smaller than the first read level R4_1 and is greater than the second read level R4_2, the second sub-node QS may become a low level.

The PMOS transistor P2 of the clamp circuit 235A may be turned on or off in response to a potential of the second sub-node QS during the period t7. For example, when a level of a threshold voltage of a memory cell is higher than the first read level R4_1 or lower than the second read level R4_2 during a previous sensing operation, because a potential of the second sub-node QS has a high level, the PMOS transistor P2 may be turned off. Accordingly, a precharge operation of the bit line BL1 is not performed, therefore, a potential of the bit line BL1 may become the ground level GND.

Alternatively, when a level of a threshold voltage of a memory cell is lower than the first read level R4_1 and higher than the second read level R4_2 during a previous sensing operation, because a potential of the second sub-node QS has a low level, the PMOS transistor P2 may be turned on. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied. The page buffer sensing signal PB_SENSE may be a third voltage V3. Accordingly, the bit line BL1 may be precharged to a potential of the main bit line voltage VBL_R4. The main bit line voltage VBL_R4 may correspond to the main read level R4 shown in FIG. 8. The third voltage V3 may be smaller than the first voltage V1 and greater than the second voltage V2.

When a precharge operation of the bit line BL1 was not performed during the previous period, that is, the period t7, and the potential level of the bit line BL1 became the ground level GND, even when a sensing operation on a main read level is performed during the period t8, sensed data may be maintained in the latch LATM without change. In other words, when a threshold voltage of a memory cell coupled to the bit line BL1 is greater than the first read level voltage R4_1, the first main node QM_N may maintain a low level, and when the threshold voltage of the memory cell is smaller than the second read level voltage R4_2, the first main node QM_N may maintain a high level.

Alternatively, when a precharge operation of the bit line BL1 was performed during the period t7, the PMOS transistor P3 may be turned off in response to the internal sensing node precharge signal SA_PRECH_N during the period t8. Accordingly, a cell current of the bit line BL1 may vary according to a threshold voltage of a memory cell coupled to the bit line BL1. The NMOS transistor N4 may maintain a turn-on state during the sensing time Sensing time of the period t8 and may then be turned off in response to the node coupling signal TRANSO. Accordingly, a potential level of the sensing node SO may be maintained at a high level or may be discharged to a low level according to a cell current of the bit line BL1. Subsequently, the main setup signal MSET having a high level may be applied to the main latch reset/setup circuit RSEM, such that the first main node QM_N of the latch LATM maintains a high level or is set up to have a low level. In other words, when a level of a threshold voltage of a memory cell coupled to the bit line BL1 is higher than the main read level R4, the first main node QM_N may become a low level, and when the level of the threshold voltage of the memory cell coupled to the bit line BL1 is lower than the main read level R4, the first main node QM_N may maintain a high level.

As described above, according to another embodiment, a sensing operation corresponding to the main read level R4 may be performed after a masking process is performed on bit lines of memory cells corresponding to the region A and the region B according to sensing results of a sensing operation corresponding to the first read level R4_1 and a sensing operation corresponding to the second read level R4_2 by changing a precharge level of the bit line BL1 in a state where the main read voltage R4 corresponding to the main read level is applied to a word line.

Figure 13:
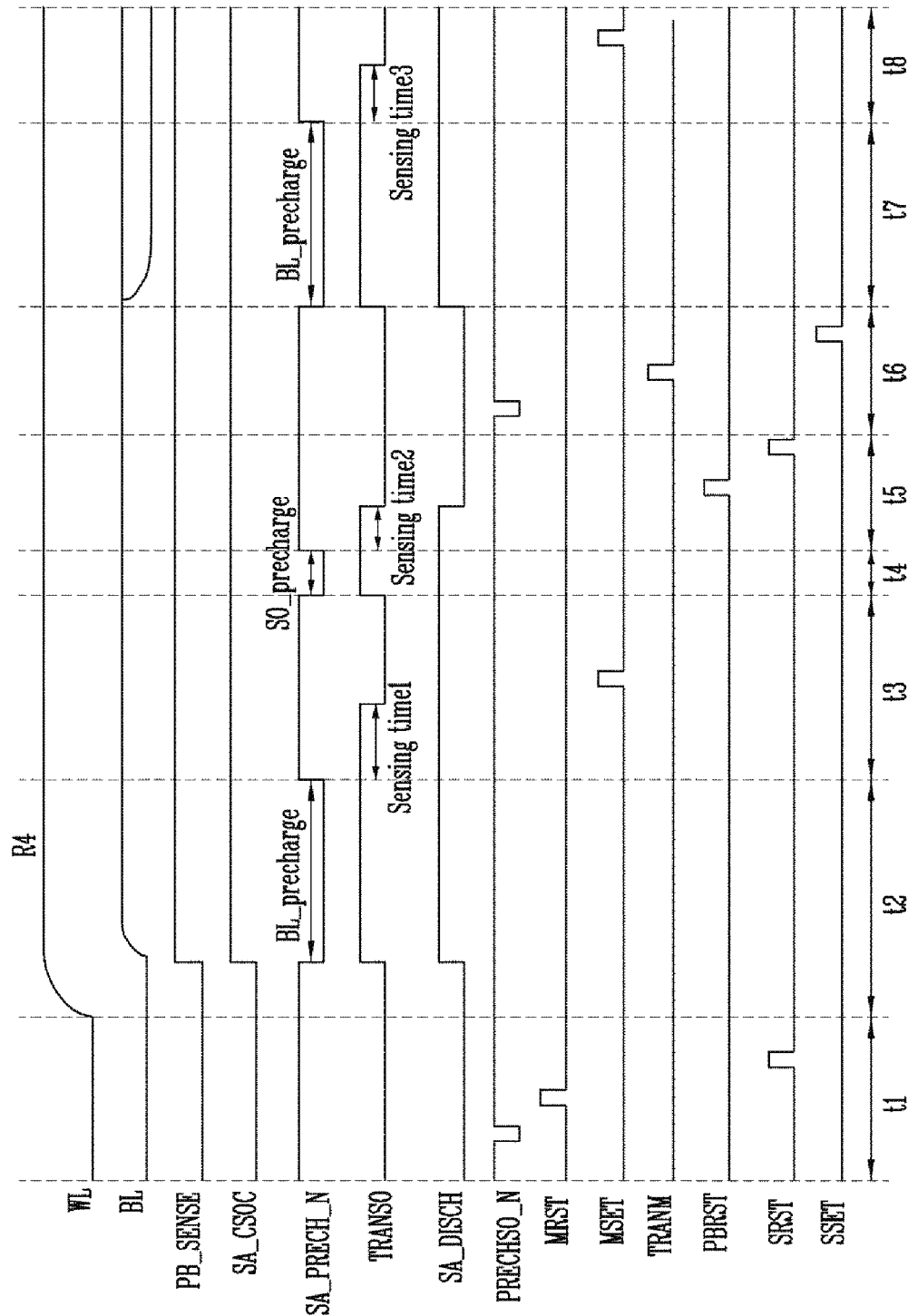
FIG. 13 is a waveform diagram of signals illustrating an operation of a page buffer according to another embodiment.

FIG. 13 is a waveform diagram of signals illustrating an operation of a page buffer according to another embodiment.

An operation of a page buffer according to another embodiment is described below with reference to FIGS. 5, 8 to 10, and 13. When a read operation is performed, a plurality of page buffers operate in a similar manner. Accordingly, the page buffer PB1 is described as an example.

In another embodiment, a read operation using the fourth read voltage R4 among the read operations using a plurality of read voltages is described as an example.

The page buffer PB1 may perform an initialization operation during the period t1. For example, the PMOS transistor P5 may be turned on in response to the precharge signal PRECHSO_N to apply the power voltage VEXT to the sensing node SO. Accordingly, the NMOS transistor N17 of the second discharge circuit 241 may be turned on to apply the ground power Vss to the common node COM. Subsequently, the main reset signal MRST having a high level may be applied to the main latch reset/setup circuit RSEM to initialize the second main node QM of the latch LATM to a low level. In addition, the sub-reset signal SRST having a high level may be applied to the sub-latch reset/setup circuit RSES to initialize the second sub-node QS of the latch LATS to a low level.

The main read voltage R4 corresponding to the main read level may be applied to the word line WL corresponding to the selected page during the period t2.

The PMOS transistor P2 of the clamp circuit 235A may be turned on in response to a potential of the second sub-node QS and the PMOS transistor P3 of the clamp circuit 235A may be turned on in response to the internal sensing node precharge signal SA_PRECH_N to apply the core voltage VCORE to the current sensing node CSO. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied.

The PMOS transistor P3 may be turned off in response to the internal sensing node precharge signal SA_PRECH_N during the period t3. Accordingly, a cell current of the bit line BL1 may vary according to a threshold voltage of a memory cell coupled to the bit line BL1. A sensing operation on the first read level R4_1 may be performed during a first sensing time Sensing time1 by controlling a turn-on period of the node coupling signal TRANSO. When the first sensing time Sensing time1 is adjusted to be relatively long, a reference current Itrip of a page buffer may be changed, and thus a sensing operation on the first read level R4_1 may be performed. For example, when a sensing time is increased in a state where the same read voltage is applied to a word line and a bit line is precharged to the same potential level, an effect of increasing a read level may be obtained. In other words, when a sensing operation is performed for the first sensing time Sensing time1 in a state where the fourth read voltage R4 is applied to a word line and the bit line BL1 is precharged to a predetermined level, a sensing result with respect to the first read level R4_1 may be obtained. The NMOS transistor N4 may maintain a turn-on state during the first sensing time Sensing time1 of the period t3 and may then be turned off in response to the node coupling signal TRANSO. Accordingly, a potential level of the sensing node SO may be maintained at a high level or may be discharged to a low level according to a cell current of the bit line BL1. Subsequently, the main setup signal MSET having a high level may be applied to the main latch reset/setup circuit RSEM, such that the first main node QM_N of the latch LATM maintains a high level or is set up to have a low level. In other words, when a threshold voltage of a memory cell coupled to the bit line BL1 is greater than the first read level voltage R4_1, the first main node QM_N may maintain a high level, and when the threshold voltage of the memory cell coupled to the bit line BL1 is smaller than the first read level voltage R4_1, the first main node QM_N may be set up to have a low level.

The PMOS transistor P2 of the clamp circuit 235A may be turned on in response to a potential of the second sub-node QS, and the PMOS transistor P3 of the clamp circuit 235A may be turned on in response to the internal sensing node precharge signal SA_PRECH_N to apply the core voltage VCORE to the current sensing node CSO during the period t4. The NMOS transistor N4 may be turned on in response to the node coupling signal TRANSO to precharge the sensing node SO. Only the sensing node SO may be precharged without performing a precharge operation on the bit line BL1 during the period t4.

The PMOS transistor P3 may be turned off in response to the internal sensing node precharge signal SA_PRECH_N during the period t5. Accordingly, a cell current of the bit line BL1 may vary according to a threshold voltage of a memory cell coupled to the bit line BL1. A sensing operation on the second read level R4_2 may be performed during a second sensing time Sensing time2 by controlling a turn-on period of the node coupling signal TRANSO. When the second sensing time Sensing time2 is adjusted to be relatively short, the reference current Itrip of a page buffer may be changed, and thus a sensing operation on the second read level R4_2 may be performed. The second sensing time Sensing time2 may be shorter than the first sensing time Sensing time1. The NMOS transistor N4 may maintain a turn-on state during the second sensing time Sensing time2 of the period t5 and may then be turned off in response to the node coupling signal TRANSO. Accordingly, a potential level of the sensing node SO may be maintained at a high level or may be discharged to a low level according to a cell current of the bit line BL1. The reset signal PBRST having a high level may be applied to the sub-latch reset/setup circuit RSES to set the first sub-node QS_N of the latch LATS to a low level. Subsequently, the sub-reset signal SRST having a high level may be applied to the sub-latch reset/setup circuit RSES, such that the second sub-node QS of the latch LATS maintains a high level or is set up to have a low level. In other words, when a threshold voltage of a memory cell coupled to the bit line BL1 is greater than the second read level voltage R4_2, the second sub-node QS may be set up to have a low level, and when the threshold voltage of the memory cell coupled to the bit line BL1 is smaller than the second read level voltage R4_2, the second sub-node QS may maintain a high level.

Sensing data stored in the latch LATM may be transmitted to the latch LATS during the period t6. Accordingly, data based on the sensing data that is sensed during the period t5 and the sensing data that is sensed during the period t3 may be newly stored in the latch LATS. For example, the PMOS transistor P5 may be turned on in response to the precharge signal PRECHSO_N to apply the power voltage VEXT to the sensing node SO. Accordingly, the sensing node SO may be precharged to a predetermined level. Subsequently, when the NMOS transistor N9 is turned on in response to the main data transmission signal TRANM, a potential level of the sensing node SO may be maintained at a precharge level or may be discharged to a low level according to a potential level of the first main node QM_N. Subsequently, the sub-setup signal SSET having a high level may be applied to the sub-latch reset/setup circuit RSES, such that the second sub-node QS of the latch LATS maintains a previous level or is set up to have a high level.

For example, when a level of a threshold voltage of a memory cell is higher than the first read level R4_1, sensing data stored in the latch LATM may be transmitted to the latch LATS and the second sub-node QS of the latch LATS may become a high level. In addition, when a level of a threshold voltage of a memory cell is lower than the second read level R4_2, sensing data stored in the latch LATS may be maintained and the second sub-node QS may maintain a high level. Alternatively, when a level of a threshold voltage of a memory cell is lower than the first read level R4_1 and is higher than the second read level R4_2, the second sub-node QS may become a low level.

The PMOS transistor P2 of the clamp circuit 235A may be turned on or off in response to a potential of the second sub-node QS during the period t7. For example, when a level of a threshold voltage of a memory cell is higher than the first read level R4_1 or lower than the second read level R4_2 during a previous sensing operation, because a potential of the second sub-node QS has a high level, the PMOS transistor P2 may be turned off. Accordingly, a precharge operation of the bit line BL1 is not performed, therefore, a potential of the bit line BL1 may become the ground level GND.

Alternatively, when a level of a threshold voltage of a memory cell is lower than the first read level R4_1 and higher than the second read level R4_2 during a previous sensing operation, because a potential of the second sub-node QS has a low level, the PMOS transistor P2 may be turned on. The NMOS transistor N1 of the bit line coupling circuit 231 may be turned on in response to the bit line select signal PB_SELBL and the NMOS transistor N3 of the page buffer sensing circuit 233 may be turned on in response to the page buffer sensing signal PB_SENSE to electrically couple the bit line BL1 to the current sensing node CSO to which the core voltage VCORE is applied. Accordingly, the bit line BL1 may be precharged to a predetermined level.

When a precharge operation of the bit line BL1 was not performed during the previous period, that is, the period t7, and the potential level of the bit line BL1 became the ground level GND, even when a sensing operation on a main read level is performed during the period t8, sensed data may be maintained in the latch LATM without change. In other words, when a threshold voltage of a memory cell coupled to the bit line BL1 is greater than the first read level voltage R4_1, the first main node QM_N may maintain a low level, and when the threshold voltage of the memory cell coupled to the bit line BL1 is smaller than the second read level voltage R4_2, the first main node QM_N may maintain a high level.

Alternatively, when a precharge operation of the bit line BL1 was performed during the period t7, the PMOS transistor P3 may be turned off in response to the internal sensing node precharge signal SA_PRECH_N during the period t8. Accordingly, a cell current of the bit line BL1 may vary according to a threshold voltage of a memory cell coupled to the bit line BL1. The NMOS transistor N4 may maintain a turn-on state during a third sensing time Sensing time3 of the period t8 and may then be turned off in response to the node coupling signal TRANSO. Accordingly, a potential level of the sensing node SO may be maintained at a high level or may be discharged to a low level according to a cell current of the bit line BL1. A sensing operation on the main read level R4 may be performed during the third sensing time Sensing time3 by adjusting a turn-on period of the node coupling signal TRANSO. The third sensing time Sensing time3 may be shorter than the first sensing time Sensing time1 and longer than the second sensing time Sensing time2. When the third sensing time Sensing time3 is adjusted to be shorter than the first sensing time Sensing time1 and longer than the second sensing time Sensing time2, the reference current Itrip of a page buffer may be changed, and thus a sensing operation on the main read level R4 may be performed.

Subsequently, the main setup signal MSET having a high level may be applied to the main latch reset/setup circuit RSEM, such that the first main node QM_N of the latch LATM maintains a high level or is set up to have a low level. In other words, when a level of a threshold voltage of a memory cell coupled to the bit line BL1 is higher than the main read level R4, the first main node QM_N may become a low level, and when the level of the threshold voltage of the memory cell coupled to the bit line BL1 is lower than the main read level R4, the first main node QM_N may maintain a high level.

As described above, according to another embodiment, a sensing operation corresponding to the main read level R4 may be performed after a masking process is performed on bit lines of memory cells corresponding to the region A and the region B according to sensing results of a sensing operation corresponding to the first read level R4_1 and a sensing operation corresponding to the second read level R4_2 by adjusting a length of a sensing time in a state where the main read voltage R4 corresponding to the main read level is applied to a word line.

Figure 14:
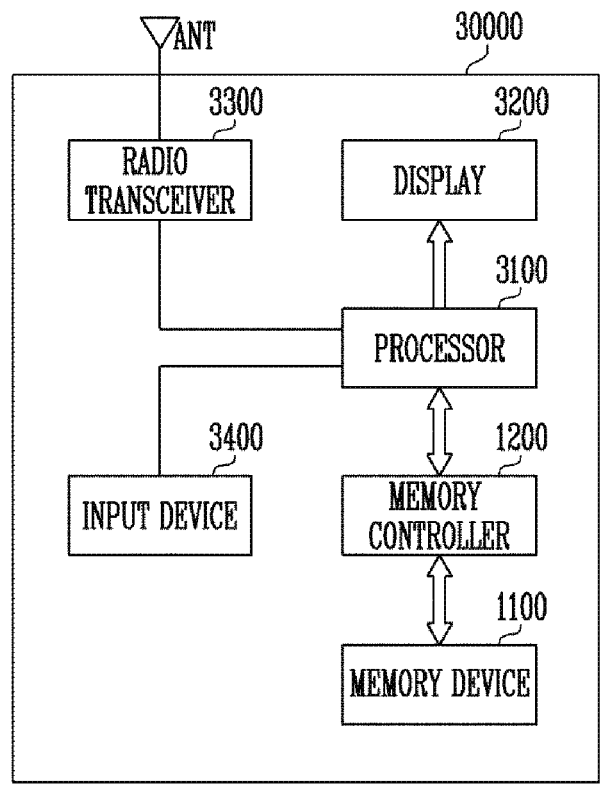
FIG. 14 is a diagram illustrating another embodiment of a memory system.

FIG. 14 is a diagram illustrating another embodiment of a memory system.

Referring to FIG. 14, a memory system 30000 may be embodied into a cellular phone, a smartphone, a tablet PC, a personal digital assistant (PDA) or a wireless communication device. The memory system 30000 may include a memory device 1100 and a memory controller 1200 controlling the operations of the memory device 1100. The memory controller 1200 may control a data access operation of the memory device 1100, for example, a program operation, an erase operation, or a read operation in response to control of a processor 3100.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 to a radio signal and output the radio signal to an external device through the antenna ANT. A control signal for controlling the operations of the processor 3100 or data to be processed by the processor 3100 may be input by an input device 3400, and the input device 3400 may include a pointing device, such as a touch pad and a computer mouse, a keypad, or a keyboard. The processor 3100 may control operations of the display 3200 so that the data output from the controller 1200, the data output from the radio transceiver 3300, or the data output from the input device 3400 may be displayed on the display 3200.

According to an embodiment, the memory controller 1200 controlling the operations of the memory device 1100 may form part of the processor 3100, or be formed as a separate chip from the processor 3100. Further, the memory device 1100 may be formed through the examples of the memory controller 1100 shown in FIG. 2.

Figure 15:
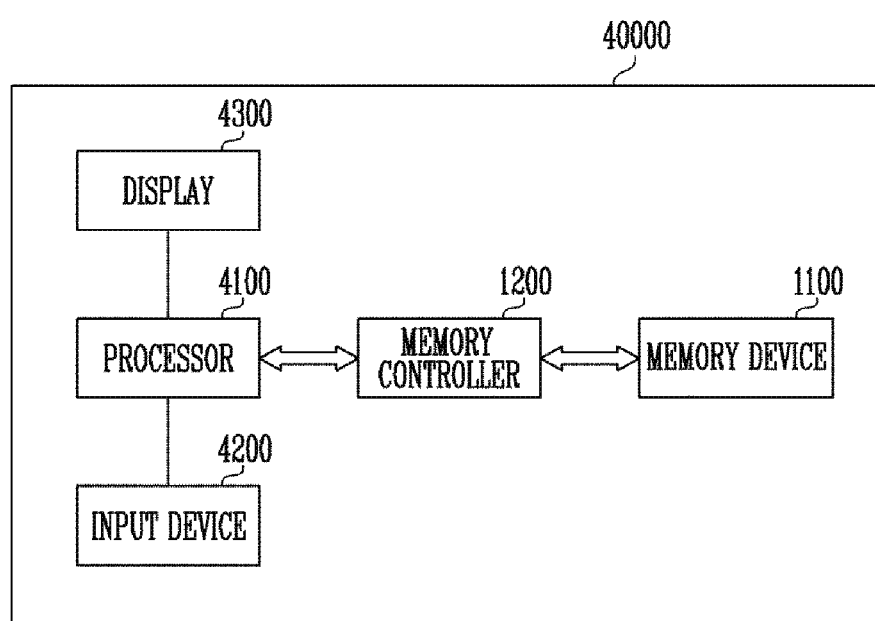
FIG. 15 is a diagram illustrating another embodiment of a memory system.

FIG. 15 is a diagram illustrating another embodiment of a memory system.

Referring to FIG. 15, a memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

A processor 4100 may output data stored in the memory device 1100 through a display 4300 according to data input through an input device 4200. Examples of the input device 4200 may include a pointing device, such as a touch pad or a computer mouse, a keypad, or a keyboard.

The processor 4100 may control the general operations of the memory system 40000 and control the operations of the memory controller 1200. According to an embodiment, the memory controller 1200 controlling the operations of the memory device 1100 may form part of the processor 4100, or be formed as a separate chip from the processor 4100. Further, the memory device 1100 may be formed through the examples of the memory controller 1100 shown in FIG. 2.

Figure 16:
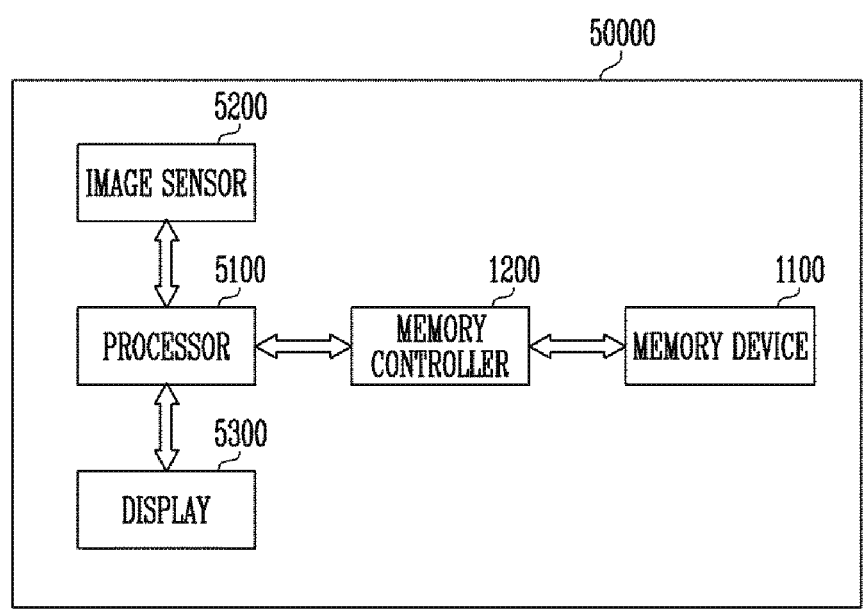
FIG. 16 is a diagram illustrating another embodiment of a memory system.

FIG. 16 is a diagram illustrating another embodiment of a memory system.

Referring to FIG. 16, a memory system 50000 may be embodied into an image processing device, for example, a digital camera, a cellular phone with a digital camera attached thereto, a smartphone with a digital camera attached thereto, or a tablet PC with a digital camera attached thereto.

The memory system 50000 may include the memory device 1100 and the memory controller 1200 controlling a data processing operation of the memory device 1100, for example, a program operation, an erase operation, or a read operation.

An image sensor 5200 of the memory system 50000 may convert an optical image into digital signals, and the digital signals may be transferred to a processor 5100 or the memory controller 1200. In response to control of the processor 5100, the digital signals may be output through a display 5300 or stored in the memory device 1100 through the controller 1200. In addition, the data stored in the memory device 1100 may be output through the display 5300 according to control of the processor 5100 or the memory controller 1200.

According to an embodiment, the memory controller 1200 controlling the operations of the memory device 1100 may form part of the processor 5100, or be formed as a separate chip from the processor 5100. Further, the memory device 1100 may be formed through the examples of the memory controller 1100 shown in FIG. 2.

Figure 17:
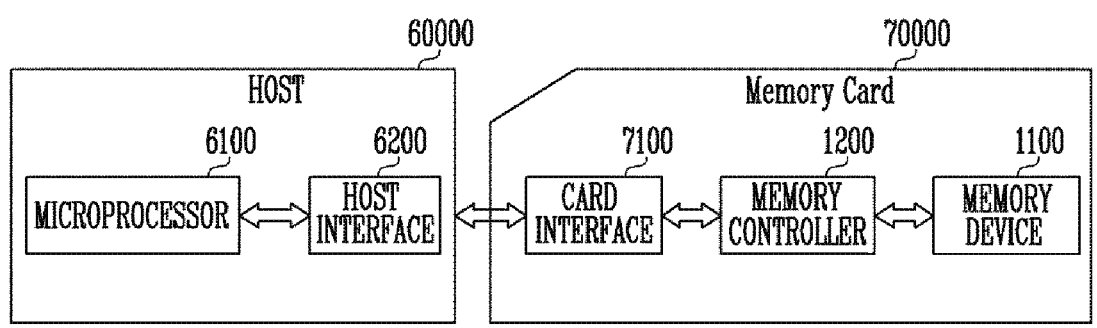
FIG. 17 is a diagram illustrating another embodiment of a memory system.

FIG. 17 is a diagram illustrating another embodiment of a memory system.

Referring to FIG. 17, a memory system 70000 may be embodied into a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be, but is not limited to, a secure digital (SD) card interface or a multi-media card (MMC) interface. Further, the memory controller 1200 may be formed through the example of the memory controller 1200 shown in FIG. 2.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to an host interface 6200 of the host 60000, such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 in response to control of a microprocessor 6100. Further, the memory device 1100 may be formed through the examples of the memory controller 1100 shown in FIG. 2.

According to the present disclosure, the reliability of a read operation of a memory device may be improved by suppressing noise caused by an adjacent bit line during the read operation.

What is claimed is:

1. A memory device, comprising:
   a memory cell array including memory cells that are programmed into a plurality of program states;
   a peripheral circuit configured to perform a read operation on the memory cell array; and
   control logic configured to control the peripheral circuit to perform:
   the read operation; and
   a masking process on first memory cells having a threshold voltage level higher than a first read level and second memory cells having a threshold voltage level lower than a second read level among the memory cells during the read operation.

2. The memory device of claim 1, wherein the first read level is higher than a main read level and the second read level is lower than the main read level.

3. The memory device of claim 2, wherein the peripheral circuit comprises:
   a voltage generating circuit configured to apply a read voltage to a selected word line among word lines of the memory cell array; and
   a page buffer group configured to precharge bit lines of the memory cell array and then sense change in current of the bit lines of the memory cell array.

4. The memory device of claim 3, wherein the page buffer group applies a ground voltage to first bit lines to which the first memory cells and the second memory cells are coupled, among the bit lines coupled to the memory cell array, and performs the masking process on the first bit lines.

5. The memory device of claim 3, wherein the control logic controls the peripheral circuit to perform a first sensing operation in which the first memory cells are sensed, a second sensing operation in which the second memory cells are sensed, and a third sensing operation in which the masking process is performed on the first and second memory cells and then the first and second memory cells are sensed.

6. The memory device of claim 5, wherein the voltage generating circuit applies a first read level voltage corresponding to the first read level to the selected word line during the first sensing operation, applies a second read level voltage corresponding to the second read level to the selected word line during the second sensing operation, and applies a main read voltage corresponding to the main read level to the selected word line during the third sensing operation.

7. The memory device of claim 6, wherein the first read level voltage is greater than the main read voltage and the second read level voltage is less than the main read voltage.

8. The memory device of claim 6, wherein the page buffer group applies a ground voltage to first bit lines corresponding to the first and second memory cells during the third sensing operation based on sensing data obtained from results of the first sensing operation and the second sensing operation, and precharges second bit lines, that is, the bit lines except for the first bit lines, to a predetermined level.

9. The memory device of claim 5, wherein the voltage generating circuit applies a main read voltage to the selected word line during the first, second, and third sensing operations, and
   wherein the page buffer group precharges the bit lines to a first bit line voltage corresponding to the first read level during the first sensing operation, precharges the bit lines to a second bit line voltage corresponding to the second read level during the second sensing operation, and precharges second bit lines, that is, the bit lines except for first bit lines, to a third bit line voltage corresponding to the main read level during the third sensing operation.

10. The memory device of claim 9, wherein the first bit line voltage is greater than the third bit line voltage and the second bit line voltage is less than the third bit line voltage.

11. The memory device of claim 5, wherein the voltage generating circuit applies a main read voltage to the selected word line during the first, second, and third sensing operations, and
    wherein the page buffer group senses the bit lines using a first reference current for a first sensing time during the first sensing operation, senses the bit lines using a second reference current for a second sensing time during the second sensing operation, and senses second bit lines, that is, the bit lines except for first bit lines, using a third reference current for a third sensing time during the third sensing operation.

12. The memory device of claim 11, wherein the first sensing time is longer than the third sensing time and the second sensing time is shorter than the third sensing time.

13. A memory device comprising:
    a page including a plurality of memory cells coupled in common to a word line;
    a peripheral circuit configured to perform a read operation on the page; and
    control logic configured to control the peripheral circuit to perform the read operation,
    wherein, during the read operation, the control logic controls the peripheral circuit to perform:
    a first sensing operation in which first memory cells having a threshold voltage level higher than or equal to a first read level that is higher than a main read level, among the plurality of memory cells, are sensed;

a second sensing operation in which second memory cells having a threshold voltage level lower than or equal to a second read level that is lower than the main read level, among the plurality of memory cells, are sensed; and a third sensing operation in which the plurality of memory cells are sensed in a state where a masking process is performed on the first memory cells and the second memory cells.

14. The memory device of claim 13, wherein the peripheral circuit changes and applies a read voltage to the word line during the first, second, and third sensing operations.

15. The memory device of claim 13, wherein the peripheral circuit changes a precharge level of bit lines coupled to the memory cells to precharge the bit lines coupled to the memory cells during the first, second, and third sensing operations.

16. The memory device of claim 13, wherein the peripheral circuit changes a sensing time during the first, second, and third sensing operations.

17. A method of operating a memory device, the method comprising:

performing a first sensing operation in which first memory cells having a threshold voltage level higher than or equal to a first read level that is higher than a main read level, among a plurality of memory cells, are sensed;

performing a second sensing operation in which second memory cells having a threshold voltage level lower than or equal to a second read level that is lower than the main read level, among the plurality of memory cells, are sensed;

performing a masking process on the first memory cells and the second memory cells; and performing a third sensing operation in which whether a threshold voltage level of the plurality of memory cells is higher or lower than the main read level is sensed.

18. The method of claim 17, wherein a ground voltage is applied to bit lines coupled to the first memory cells and the second memory cells during the third sensing operation by performing the masking process.

19. The method of claim 17, wherein a read voltage varies and is applied to the word line during the first, second, and third sensing operations.

20. The method of claim 17, wherein a precharge level of bit lines coupled to the memory cells varies to precharge the bit lines coupled to the memory cells during the first, second, and third sensing operations.

21. The method of claim 17, wherein a sensing time varies during the first, second, and third sensing operations.

* * * * *